(12) United States Patent
Ujiie et al.

(10) Patent No.: US 7,371,606 B2
(45) Date of Patent: May 13, 2008

(54) MANUFACTURING METHOD OF A SEMICONDUCTOR DEVICE

(75) Inventors: Kenji Ujiie, Kokubunji (JP); Bunji Kuratomi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 126 days.

(21) Appl. No.: 11/012,156

(22) Filed: Dec. 16, 2004

(65) Prior Publication Data

US 2005/0133895 A1  Jun. 23, 2005

(30) Foreign Application Priority Data

Dec. 22, 2003  (JP)  ............................. 2003-424923

(51) Int. Cl.
*H01L 21/66* (2006.01)
*H01L 21/00* (2006.01)
*H01L 23/495* (2006.01)
*H01L 23/28* (2006.01)

(52) U.S. Cl. .................... 438/106; 438/15; 438/25; 438/26; 438/51; 438/55; 438/64; 438/112; 438/124; 438/125; 438/126; 438/127; 257/667; 257/787

(58) Field of Classification Search ............. None
See application file for complete search history.

(56) References Cited

U.S. PATENT DOCUMENTS 5,817,545 A * 10/1998 Wang et al. ............... 438/127

| 5,998,243 | A * | 12/1999 | Odashima et al. | .......... 438/127 |
| 6,459,159 | B1 * | 10/2002 | Miyagawa et al. | .......... 257/778 |
| 6,767,676 | B2 * | 7/2004 | Nagao | ................ 430/11 |
| 6,988,882 | B2 * | 1/2006 | Boyaud et al. | ............. 425/542 |
| 2002/0019072 | A1 * | 2/2002 | Kobayashi et al. | .......... 438/107 |
| 2004/0175866 | A1 * | 9/2004 | Woerz et al. | ............... 438/127 |

FOREIGN PATENT DOCUMENTS

JP   11-121488   4/1999
JP   2001-135658   5/2001

OTHER PUBLICATIONS

Chinese Official Action for Application No. 200410104607.0, dated Oct. 12, 2007.

* cited by examiner

*Primary Examiner*—Thao X. Le
*Assistant Examiner*—James M Mitchell
(74) *Attorney, Agent, or Firm*—Antonelli, Terry, Stout & Kraus, LLP.

(57) ABSTRACT

The yield of a sealing process for a semiconductor device which adopts a flip-chip mounting method is to be improved. In a molding process wherein plural semiconductor chip ICs mounted on a parts mounting surface of a substrate matrix through bump electrodes are to be sealed all together with a sealing resin in a reduced state of the internal pressure of a cavity of a molding apparatus, a clamping pressure at the time of clamping the substrate matrix by both a lower die and an upper die of a molding die is set at a relatively low pressure in an initial stage of injection of the sealing resin and is changed to a relatively high pressure when the sealing resin has covered the semiconductor chip ICs located in a final stage in the resin injecting direction.

9 Claims, 26 Drawing Sheets

FIG. 37

| REDUCTION OF PRESSURE | NUMBER OF VOIDS | |
|---|---|---|
| | CHIP-TO-SUBSTRATE | BACK SURFACE OF CHIP |
| NO | 3/27 | 8/27 |
| YES | 0/27 | 0/27 |

MANUFACTURING METHOD OF A SEMICONDUCTOR DEVICE

CROSS-REFERENCE TO RELATED APPLICATION

The present application claims priority from Japanese patent application No. 2003-424923 filed on Dec. 22, 2003, the content of which is hereby incorporated by reference into this application.

BACKGROUND OF THE INVENTION

The present invention relates to a semiconductor device manufacturing method and a semiconductor device technique. Particularly, the present invention is concerned with a technique applicable effectively to a resin sealing technique for a semiconductor device which adopts a flip-chip mounting method.

The flip-chip mounting method is one of mounting methods for mounting a semiconductor chip onto a wiring substrate through bump electrodes (protrude electrodes). In connection with the flip-chip mounting method, as a method for injecting resin into the gap between a semiconductor chip and a wiring board, there is known a method wherein liquid resin is added dropwise to a part of the outer periphery of the semiconductor chip and the resin, in a softened state by heating, is penetrated into the gap between the semiconductor chip and the wiring substrate by utilizing the capillary phenomenon. According to this method, however, since the injection of resin is performed for each semiconductor chip, it takes time for the injection of resin and thus the productivity is low; besides, the resin itself is expensive, resulting in that the cost of the semiconductor device becomes high.

On the other hand, as a semiconductor chip sealing method, there is known an MAP (Mold Array Package) method wherein plural semiconductor chips are mounted on a wiring substrate, then are covered all together with a sealing resin, and are then cut out into individual semiconductor chips. According to this method, since plural semiconductor chips can be sealed all together, it is possible to shorten the sealing time and improve the productivity of semiconductor devices. Besides, the cost of the sealing material itself is about one tenths of that in the foregoing known method and is thus much lower. Consequently, it is possible to reduce the cost of each semiconductor device manufactured.

However, if the above MAP method is adopted in the flip-chip mounting method, since the gap between the semiconductor chip and the wiring substrate is narrow, the sealing resin cannot sufficiently be injected into the gap, thus giving rise to the problem that voids are formed. If voids are formed due to insufficient injection of the sealing resin into the gap between the semiconductor chip and the wiring substrate, there arise the problem that mutually adjacent bump electrodes melt at the time of heat treatment after the sealing step and are short-circuited through the voids and the problem that the bump electrodes are apt to be disconnected due to deformation of the wiring substrate and a sealing body caused by a temperature cycle after the sealing step.

A countermeasure to the formation of such voids in the semiconductor device which adopts the flip-chip mounting method is described in, for example, Japanese Unexamined Patent Publication No. Hei 11(1999)-121488. It is described therein that the interior of a molding die cavity is brought into a state of reduced pressure in a resin sealing step, whereby a sealing resin can be injected uniformly into the gap between a semiconductor chip and a wiring substrate (see Patent Literature 1). Further, for example in Japanese Unexamined Patent Publication No. 2001-135658 it is described that, by reducing the internal pressure of a molding die cavity in a resin sealing step, molten resin can be injected stably into the whole of the interior of the cavity while suppressing the formation of voids (see Patent Literature 2).

[Patent Literature 1]
Japanese Unexamined Patent Publication Hei 11(1999)-121488

[Patent Literature 2]
Japanese Unexamined Patent Publication No. 2001-135658

However, the present inventor has found out that the following problem is involved in the technique of reducing the internal pressure of a molding die cavity when sealing resin in the semiconductor device which adopts the flip-chip mounting method.

In the above Patent Literatures 1 and 2, a thorough consideration is not given to the occurrence of variations in thickness of wiring substrates. In an actual resin sealing step for a semiconductor device which adopts the flip-chip mounting method, even if the interior of a molding die cavity is brought into a state of reduced pressure, sealing resin cannot sufficiently be injected to the back side of the semiconductor chip lying within the cavity, especially into the gap between the semiconductor chip and the wiring substrate used, and voids may occur.

At present, molding dies are designed on the assumption that a lead frame is used as a semiconductor chip mounting member. Lead frames are almost constant in thickness, while wiring substrates vary in thickness with an increase in the number of constituent layers, and the range of error is also becoming larger. Sealing resin is injected into a cavity of a molding die while a part of a wiring substrate is crushed by the molding die lest the sealing resin should leak from the cavity in a sealing step. However, if the thickness of the wiring substrate placed within the molding die is larger than a preset value although it is within a tolerance, the proportion of the crushed portion of the wiring substrate becomes larger than a preset value and hence air vents in the molding die are closed with a portion of the wiring substrate. As a result, it becomes impossible to let the gas present within the cavity escape sufficiently to the exterior, thus giving rise to the problem that voids are formed. Especially in the case of the flip-chip mounting method, the problem of voids is apt to occur because the gap between the semiconductor chip and the wiring substrate is very narrow and tends to become still narrower. On the other hand, if the thickness of the wiring substrate placed within the molding die is smaller than the preset value although it is within the tolerance, the proportion of the crushed portion of the wiring substrate becomes excessively smaller than the preset value, so that the openings of air vents become larger than necessary, with consequent leakage of the sealing resin to the exterior from the air vents. Once the sealing resin leaks to an outer frame of the wiring substrate, it becomes impossible to effect automatic conveyance, thus giving rise to the problem that the yield and productivity in manufacturing the semiconductor device are deteriorated.

SUMMARY OF THE INVENTION

It is an object of the present invention to provide a technique able to improve the yield in a sealing step for a semiconductor device which adopts the flip-chip mounting method.

The above and other objects and novel features of the present invention will become apparent from the following description and the accompanying drawings.

Typical modes of the present invention as disclosed herein will be outlined below.

According to the present invention, when a semiconductor chip mounted on a substrate through protruded electrodes is to be sealed with sealing resin, the internal pressure of a cavity of a molding die is reduced and a substrate clamping pressure of the molding die is changed from a low (weak) pressure to a high (strong) pressure.

Further, according to the present invention, a semiconductor chip mounted on a substrate through protruded electrodes is sealed with resin by use of a molding die and in a state of reduced pressure of the interior of a cavity of the molding die, the molding die having movable pins in air vents, the movable pins being provided in a movable state in a direction intersecting a molding surface by means of an elastic member and each having a groove formed in a surface thereof opposed to the substrate.

Effects obtained by the typical modes of the present invention as disclosed herein will be outlined below.

When the semiconductor chip mounted on the substrate through protruded electrodes is to be sealed with resin, the internal pressure of the cavity of the molding die is reduced and the substrate clamping pressure of the molding die is changed from low to high, so that the gap between the semiconductor chip and the substrate can be filled sufficiently with the sealing resin, whereby the yield in the semiconductor device sealing step can be improved.

BRIEF DESCRIPTION OF THE DRAWINGS

FIG. 37 illustrates the number of voids formed after the molding step;

DETAILED DESCRIPTION OF THE PREFERRED EMBODIMENTS

Figure 1:
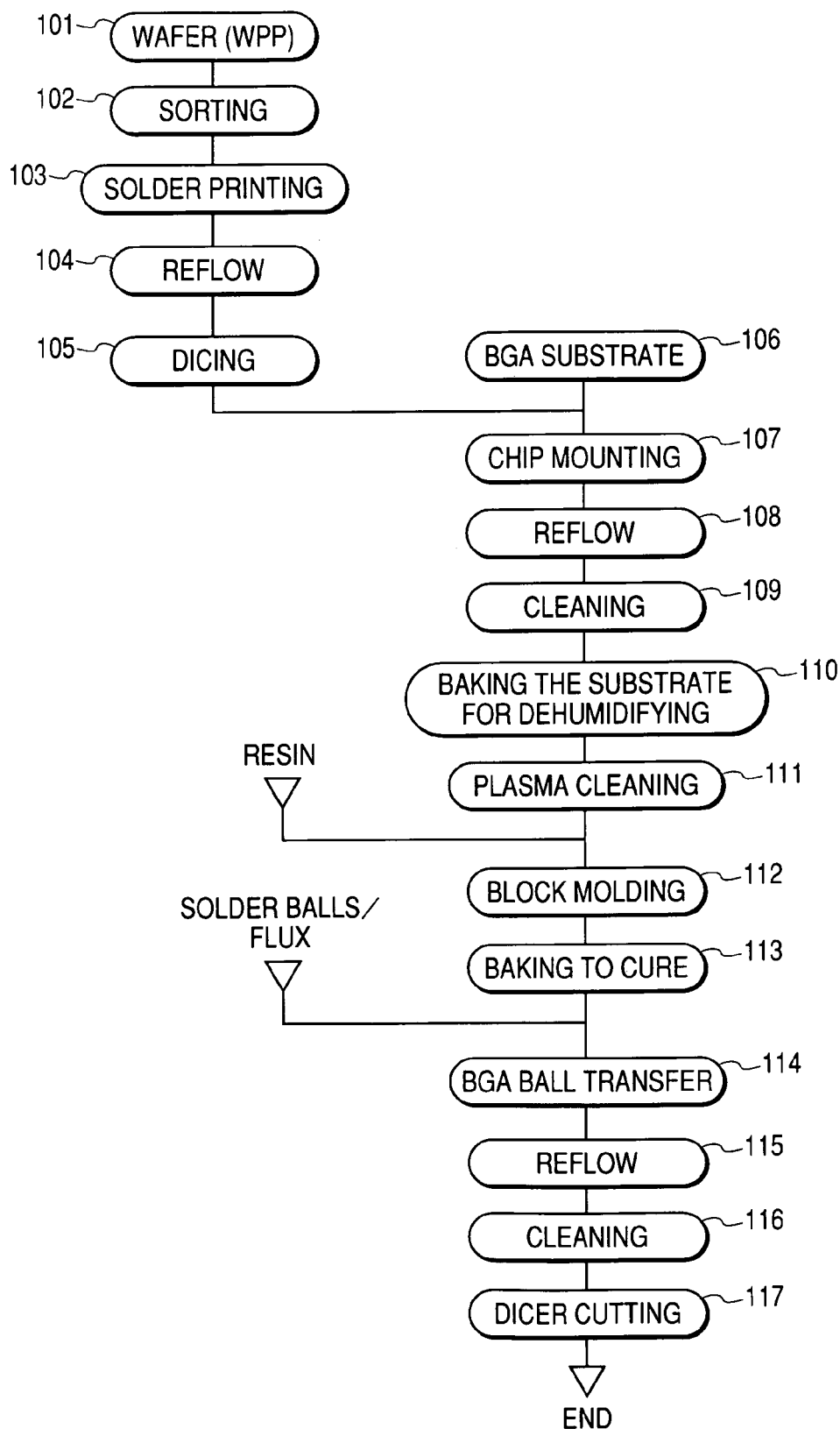
FIG. 1 is a process chart showing a semiconductor device manufacturing process according to a first embodiment of the present invention.

Where required for convenience' sake, the following embodiments will each be described in a divided manner into plural sections or embodiments, but unless otherwise mentioned, they are not unrelated to each other, but are in a relation such that one is a modification, a detailed description, or a supplementary explanation, or part or the whole of the other. In the following embodiments, reference is made to the number of elements (including the number, numerical value, quantity, and range), no limitation is made to the number referred to, but numerals above and below the number referred to will do as well unless otherwise mentioned and except the case it is basically evident that limitation is made to the number referred to. Moreover, in the following embodiments, it goes without saying that the constituent elements (including constituent steps) are not always be essential unless otherwise mentioned and except the case where they are considered essential basically clearly. Likewise, in the following embodiments, when reference is made to the shape, position, and relation of the constituent elements, etc., those substantially similar or closely similar thereto are also included in the present invention unless otherwise mentioned and except the case where they are not considered similar or closely similar thereto basically clearly. This is also true of the above numerical value and range. Further, in all of the drawings for explaining the embodiments, portions having the same functions are identified by the same reference numerals, and repeated explanations thereof will be omitted. Embodiments of the present invention will be described in detail hereinunder with reference to the accompanying drawings.

First Embodiment

An example of a semiconductor device manufacturing method according to an embodiment of the present invention will be described below with reference to FIGS. 2 to 24 and in accordance with the process flow shown in FIG. 1.

First, a description will be given of steps (Steps 101 to 105 in FIG. 1) up to the provision of semiconductor chips (hereinafter referred to simply as "chips").

Figure 2:
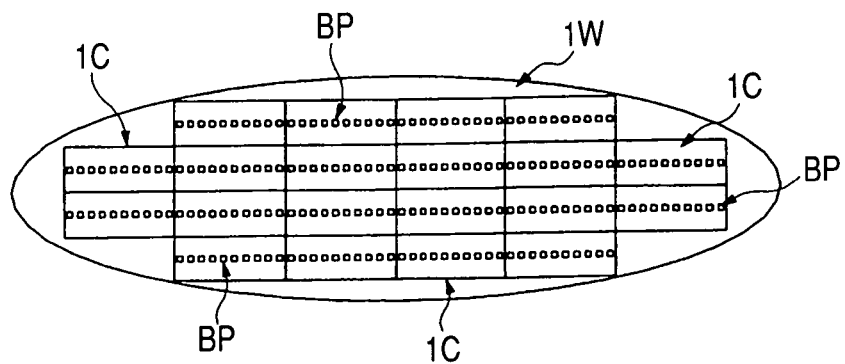
FIG. 2 is an entire plan view of a wafer in a manufacturing step in the semiconductor device manufacturing process.

FIG. 2 is an entire plan view of a wafer 1W after a wafer process. The wafer process, which is also called a pre-process, generally involves such operations as forming elements and wiring layers on a main surface of the wafer 1W having been subjected to mirror polish, forming a surface protecting film, and making it possible to conduct an electrical characteristic test of each of plural chip ICs formed on the wafer 1W, with use of a probe or the like. For example, the wafer 1W is formed in a generally circular shape in plan, and rectangular chip ICs are regularly arranged side by side on the wafer main surface in both vertical and transverse directions in FIG. 2. Centrally in the width direction of a main surface of each chip IC there are arranged plural bonding pads BP side by side in the longitudinal direction of the chip IC (center pad arrangement). The bonding pads BP, which are also called external terminals, are electrodes having the function of drawing out electrodes such as elements and circuits formed on the chip IC to the exterior. The above electrical characteristic test of each chip IC is conducted by contact of the probe with the bonding pads BP.

Figure 3:
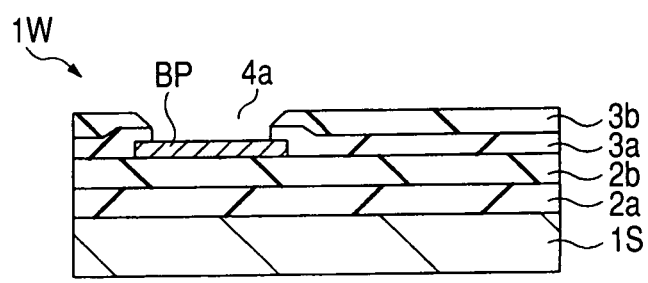
FIG. 3 is an enlarged sectional view of a principal portion of the wafer in the manufacturing step of FIG. 2.

FIG. 3 is an enlarged sectional view of the wafer 1W which is in the stage of FIG. 2. A semiconductor substrate 1S which constitutes the wafer 1W is formed of a single crystal of silicon (Si) for example and elements for forming a memory circuit such as, for example, SRAM (Static Random Access Memory), as well as a multi-layer interconnection, are formed on a main surface of the semiconductor substrate 1S. The elements formed on each chip IC are not limited to those for SRAM circuit, but various changes may be made. For example, elements for other memory circuits than SRAM, e.g., DRAM and flash memory, elements for logic circuits such as a microprocessor, or both elements for memory circuit and logic circuit, may be formed. The multi-layer interconnection has a construction such that wiring lines and insulating films 2a, 2b are stacked alternately in a direction perpendicular to the main surface of each chip IC. The bonding pads BP are formed on the top wiring layer. The bonding pads BP are formed by patterning the same material as wiring, e.g., aluminum or aluminum alloy, in the same step as the wiring step. Surfaces of the bonding pads 3a, except a portion thereof, are covered with a surface protecting film 3a. For example, the surface protecting film 3a is constituted by a silicon oxide film, a silicon nitride film, or a laminate of both films, and a surface protecting film 3b is formed of a photosensitive polyimide resin for example is deposited on the surface protecting film 3a. In the surface protecting films 3a and 3b are formed apertures 4a so that the bonding pads BP are partially exposed thereto.

Figure 4:
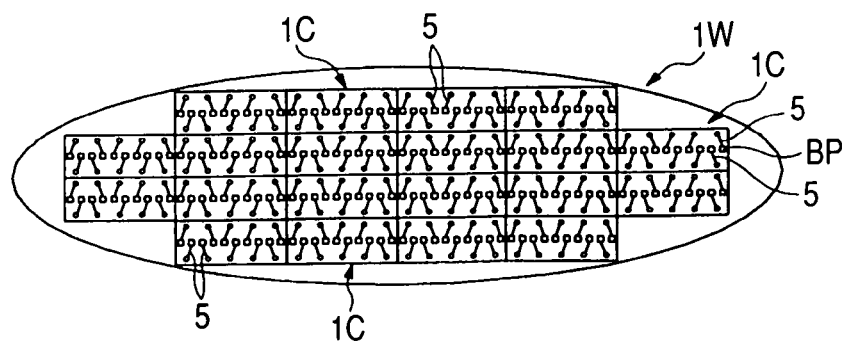
FIG. 4 is an entire plan view of the wafer in a manufacturing step which follows the step of FIG. 2.
Figure 5:
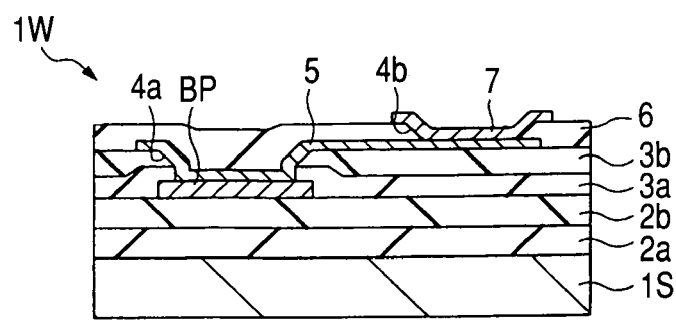
FIG. 5 is an enlarged sectional view of the wafer in the manufacturing step of FIG. 4.

First, as shown in FIGS. 4 and 5, re-wiring lines 5 are formed on the main surface of the wafer 1W. FIG. 4 is an entire plan view of the wafer 1W after formation of the re-wiring lines, etc., and FIG. 5 is an enlarged sectional view of a principal portion of the wafer 1W which is in the stage of FIG. 4. The re-wiring lines 5 are for electrically connecting the bonding pads BP on each chip IC with bump electrodes which are for mounting the chip IC on a predetermined wiring substrate. The re-wiring lines 5 have a function for matching the size of the bonding pads BP determined by a wafer process size and that of the bump electrodes determined by a package process size. That is, the size of each bump electrode (the size of the electrode itself and the spacing or pitch between adjacent electrodes) is determined by the size on the wiring substrate side and is required to be relatively larger tan the size of each bonding pad BP (the size of the pad itself and the spacing or pitch between adjacent pads). Therefore, the fine bonding pads BP whose size is determined by the wafer process can not be used as they are as bump electrodes. In view of this point, the bonding pads BP are drawn out through the re-wiring lines 5 to an empty region of a relatively large area on the main surface of each chip IC and the bump electrodes of a relatively large size are disposed in that region. For example, the re-wiring lines 5 formed on the surface protecting film 3b are formed by deposition of a main wiring-forming conductor film such as copper film on a barrier conductor film such as chromium. The re-wiring lines 5 are electrically connected with the bonding pads BP through the apertures 4a. The barrier film possesses not only a copper diffusion preventing function but also a function of improving the adhesion to polyimide resin. No limitation is made to chromium, but various changes may be made. For example, titanium, titanium-tungsten, titanium nitride, or tungsten, may be used.

Subsequently, a sealing resin film 6 formed of a photosensitive polyimide resin for example is deposited on the main surface of the wafer 1W and plural chip ICs on the main surface of the wafer 1W are sealed all together in the stage of the wafer 1W (Step 101 in FIG. 1). This process is called a wafer process package (WPP) and it becomes possible to simplify the packaging process. The sealing resin 6 becomes the top insulating film on each chip IC. If an inorganic insulating film is used as the top insulating film which covers the re-wiring lines 5, the film is apt to be cracked when handling (e.g., conveying) the chip IC and hence the handling of the chip IC becomes difficult. On the other hand, an organic insulating film such as a polyimide resin film is relatively soft, so by using an organic insulating film as the top insulating film it is made possible to facilitate the handling of the chip IC.

Thereafter, apertures 4b are formed in part of the sealing resin layer 6 by exposure and development treatment in such a manner that the re-wiring lines 5 are partially exposed thereto. Then, for example, chromium or chromium-copper alloy, and gold, are deposited on the main surface of the wafer 1W successively from below by a sputtering method. Subsequently, the resulting laminate film is subjected to etching for patterning with a resist pattern as an etching mask to form bump base metal patterns 7. The bump base metal patterns 7 are electrically connected to the re-wiring lines 5 through the apertures 4b.

Figure 6:
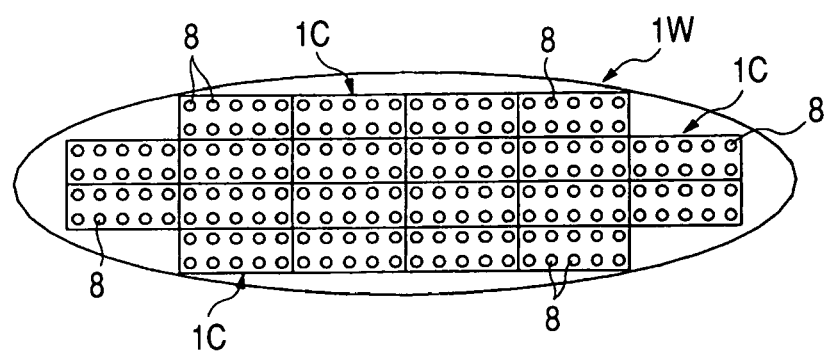
FIG. 6 is an entire plan view of the wafer in a manufacturing step which follows the step of FIG. 4.
Figure 7:
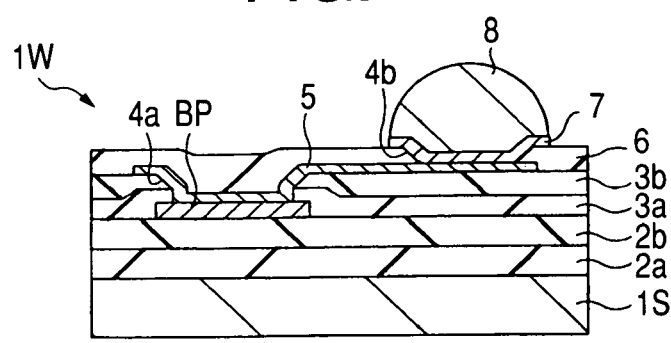
FIG. 7 is an enlarged sectional view of a principal portion of the wafer in the manufacturing step of FIG. 6.

Next, an electrical characteristic test is conducted for plural chip ICs on the wafer 1W to effect sorting of the chip ICs (Step 102 in FIG. 1) and thereafter bump electrodes (protrude electrodes) 8 are formed on the main surface of the wafer 1W, as shown in FIGS. 6 and 7. FIG. 6 is an entire plan view of the wafer 1W after forming the bump electrodes 8 on the main surface of the wafer 1W shown in FIG. 4, and FIG. 7 is an enlarged sectional view of a principal portion of the wafer 1W in the stage of FIG. 6. The bump electrodes 8 are formed by printing a solder paste of, for example, lead-tin alloy onto the main surface of the wafer 1W (Step 103 in FIG. 1) and by subsequent heat treatment for the wafer 1W (Step 104 in FIG. 1). The bump electrodes 8 are electrically connected to the re-wiring lines 5 through the bump base metal patterns 7 and are further connected electrically to the bonding pads BP through the re-wiring lines 5.

Figure 8:
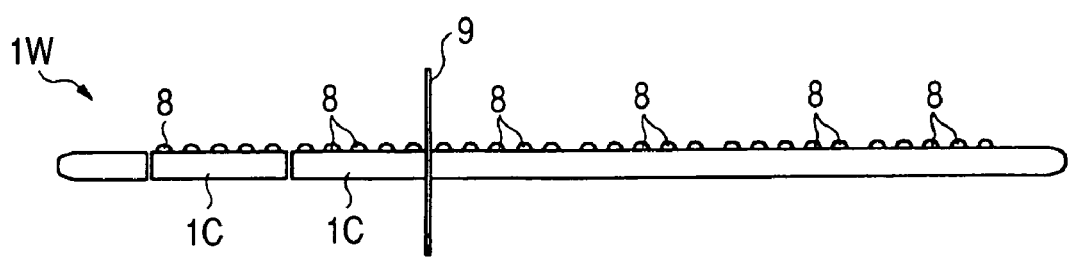
FIG. 8 is a side view of the wafer in a dicing step as a manufacturing step which follows the step of FIG. 6.
Figure 9:
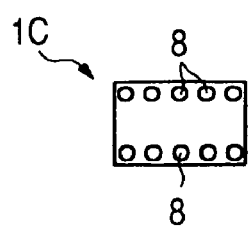
FIG. 9 is an entire plan view of a semiconductor chip which has been cut out from the wafer by the dicing step of FIG. 8.

Subsequently, as shown in FIG. 8, the wafer 1W is cut by a dicing blade 9 and such a chip IC as shown in FIG. 9 is thereby cut out from the wafer 1W (Step 105 in FIG. 1). The chip IC is provided in this way. For example, the chip IC has a CSP (Chip Size Package) structure. A planar size of the chip IC is about 11 mm×13 mm for example. Its thickness is not specially limited, but is about 400 μm for example.

Next, the following description is provided about steps from the provision of a wiring base matrix (merely "substrate matrix" hereinafter) up to a step just before shift to a molding step (Steps 106 to 111 in FIG. 1).

Figure 10:
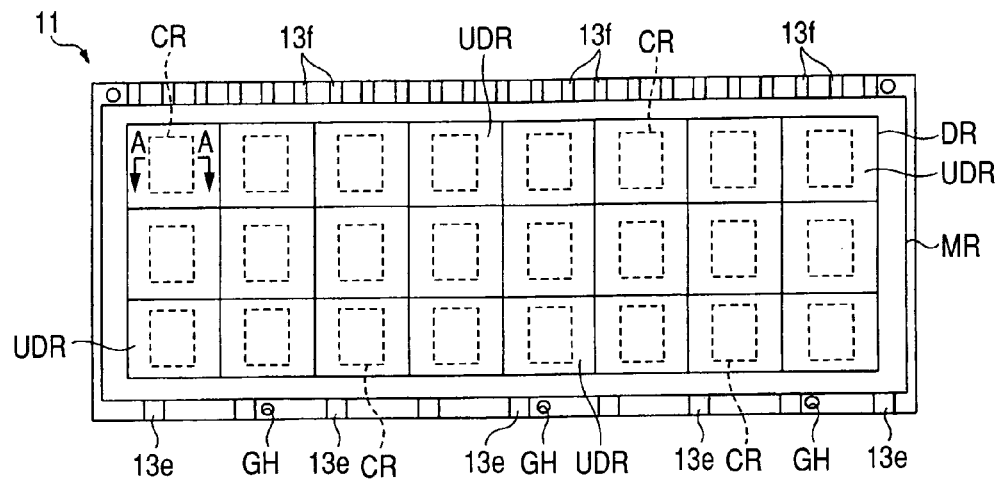
FIG. 10 is an entire plan view of a wiring substrate matrix used in the semiconductor device manufacturing process of the embodiment.
Figure 11:
FIG. 11 is a side view thereof.
Figure 12:
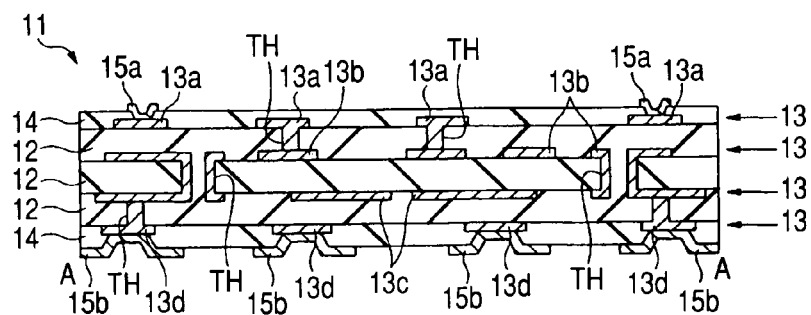
FIG. 12 is a sectional view taken on line A-A in FIG. 10.

First, such a substrate matrix (substrate, multi-layer wiring substrate) 11 as shown in FIGS. 10 to 12 (Step 106 in FIG. 1). FIG. 10 is an entire plan view of the substrate matrix 11, FIG. 11 is a side view thereof, and FIG. 12 is a sectional view taken on line A-A in FIG. 11.

The substrate matrix 11 is a matrix for forming a wiring substrate of for example BGA (Ball Grid Array) type and its appearance is like a thin sheet which is rectangular in plan. A planar size of the substrate matrix 11 is, for example, about 151 mm×66 mm and its thickness is, for example, about 340 μm. The substrate matrix 11 has a main surface and a back surface on the side opposite to the main surface. As will be described later, the main surface of the substrate matrix 11 is a parts mounting surface for mounting thereon of the chip ICS and the back surface of the substrate matrix 11 is a bump electrodes-forming surface for forming thereon of bump electrodes. A product region DR is disposed on the substrate matrix 11. In the product area DR, plural unit product regions UDR of the same size and shape are arranged in adjacency to one another in both vertical and transverse directions in FIG. 10. In the illustrated example, a total of twenty-four (3×8=24) of unit product regions UDR are arranged. Each unit product region UDR has a wiring substrate configuration necessary for constituting one semiconductor device. Plural guide holes GH are formed in the vicinity of one long side which constitutes a part of the outer periphery of the substrate matrix 11, the guide holes GH extending through the surface and the back surface of the substrate matrix 11. Alignment between a lower die of a molding die and the substrate matrix 11 can be done by inserting guide pins of the molding die which will be described later into the guide holes GH. The mark CR indicated by a broken line denotes a chip mounting region, and the mark MR denotes a molding region.

The substrate matrix 11 has a multi-layer wiring structure. A four-layer wiring structure is illustrated in FIG. 12. In the same figure, an upper surface of the substrate matrix 11 indicates the parts mounting surface, while a lower surface of the substrate matrix 11 indicates the bump electrodes-forming surface. The substrate matrix 11 includes a laminated formed by stacking insulating layers (cores) 12 and wiring layers 13 alternately and solder resists 14 formed on both upper and lower surfaces (the parts mounting surface and the bump electrodes-forming surface) of the laminate. For example, the insulating layer 12 is formed of a highly heat-resistant glass fabric-based epoxy resin. The material of the insulating layer 12 is not limited thereto, but various changes may be made. For example, BT resin or aramid nonwoven cloth may be used. In case of selecting BT resin as the material of the insulating layer 12, it is possible to improve the heat dissipating performance because BT resin is high in thermal conductivity.

Various conductor patterns 13a-13f are formed in the wiring layers 13 of the substrate matrix 11. The conductor patterns 13a-13f are formed by etching copper (Cu) foil for example. The conductor patterns 13a-13d are patterns for wiring or electrodes for the supply of signals and supply voltage. The conductor patterns 13a-13d in the wiring layers 13 are electrically connected to one another through a conductor (e.g., copper foil) disposed within through holes TH.

Conductor patterns 13e are portions on which gates in the molding die are superimposed in the molding step to be described later and are arranged at desired intervals near and along one long side of the substrate matrix 11. Conductor patterns 13f are portions on which air vents in the molding die are superimposed in the molding step to be described later and are arranged at desired intervals near and along the other long side of the substrate matrix 11. The conductor patterns 13e and 13f are for permitting easy release of the substrate matrix 11 from sealing resin to be described later. Surfaces of the conductor patterns 13e and 13f are exposed and are plated with gold for example.

Among the conductor patterns 13a and 13d in the wiring layers 13 formed on the parts mounting surface and the bump electrodes-forming surface of the substrate matrix 11 there are included those connected electrically to the bump base metal patterns 15a and 15b. The bump base metal patterns 15a on the parts mounting surface of the substrate matrix 11 are electrodes to which the bump electrodes 8 of the chip IC are bonded, and are circular in plan. The bump base metal patterns 15b on the bump electrodes-forming surface of the substrate matrix 11 are electrodes on which bump electrodes to be described later are formed, and are in a circular shape in plan larger in diameter than the bump base metal patterns 15a. The bump base metal patterns 15b are arranged respectively at lattice-like intersecting points in each unit product region UDR.

The solder resist 14, which is also called solder mask or stop-off, functions to prevent molten solder from coming into contact with conductor patterns not to be soldered and also functions as a protective film to protect the conductor patterns other than soldered portions from molten solder. The solder resist 14 further functions to prevent solder bridge between soldered portions, protect from stain and moisture, prevent damage, resist environment, prevent migration, ensure insulation between circuits, and prevent short-circuit between circuits and other parts (chips and a printed circuit board). The solder resist 14 is formed using, for example, a polyimide resin in specific regions of the main surface and the back surface of the substrate matrix 1.

Although the substrate matrix 1 of a four-layer wiring structure is illustrated, no limitation is made thereto. In the semiconductor device molding process, substrate matrices 11 of various wiring layer constructions (various types), including substrate matrices 11 of a two-layer wiring structure less than four layers and substrate matrices 11 of a six-layer wiring structure more than four layers, flow lot by lot. If the number of wiring layers (type) changes, so does the thickness of the substrate matrix 11 (in the present situation the thickness changes for example in the range of about 210 to 1000 μm). In the case where the substrate matrix 11 is of a multi-layer wiring structure, the thickness of the substrate matrix 1 changes within the range of tolerance (in the present situation the thickness changes for example in the range of about ±15 to ±30 μm) even if the number of wiring layers is the same. Particularly, according to the recent tendency, the number of wiring layers is becoming larger, with consequent expansion of the range of thickness tolerance. Therefore, in the molding step to be described later, it is an important subject how to cope with the change in thickness of the substrate matrix 11 versatilely.

Figure 13:
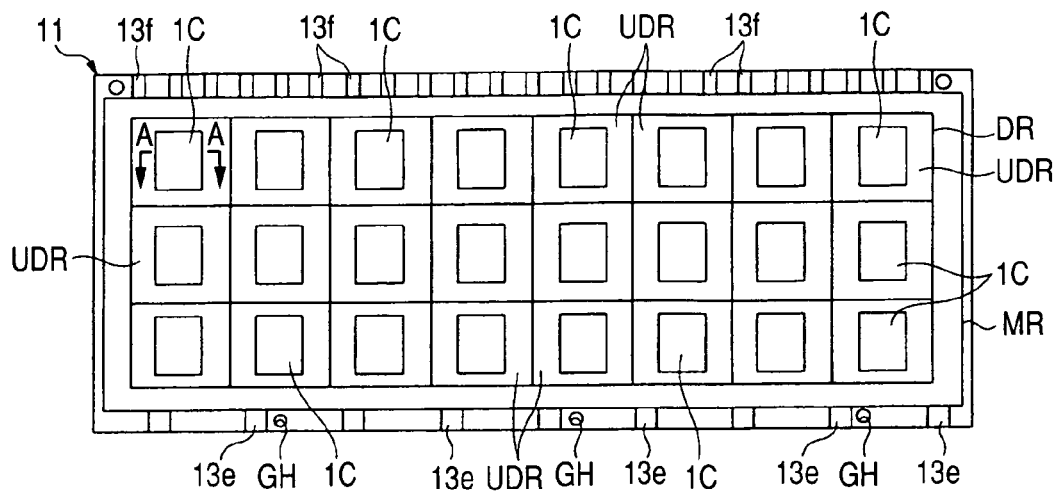
FIG. 13 is an entire plan view of the wiring substrate matrix after the mounting of semiconductor chips on a main surface of the wiring substrate matrix shown in FIG. 10.
Figure 14:
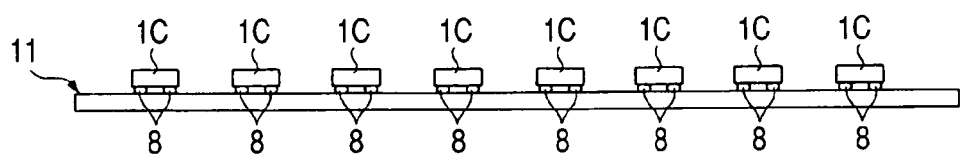
FIG. 14 is a side view thereof.
Figure 15:
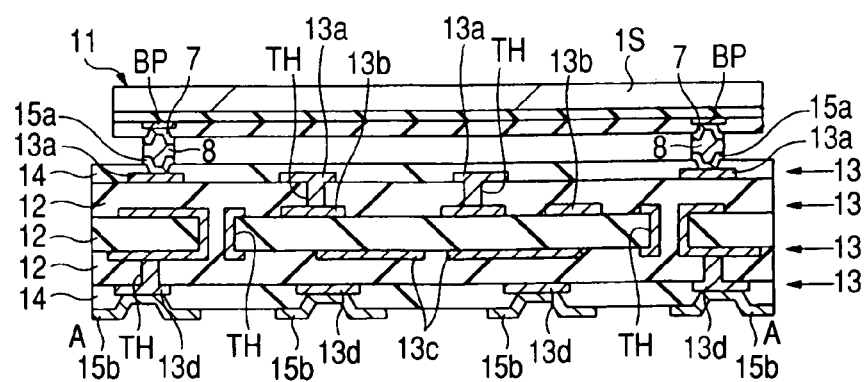
FIG. 15 is a sectional view taken on line A-A in FIG. 13.

Subsequently, as shown in FIGS. 13 to 15, chip ICs are mounted respectively in the unit product regions UDR of the substrate matrix 11 of the above construction in accordance with the flip-chip mounting method. FIG. 13 is an entire plan view of the substrate matrix 11 after mounting chip ICs, FIG. 14 is a side view thereof, and FIG. 15 is a sectional view taken on line A-A in FIG. 13. In this step, first, the bump electrodes-forming surface of each chip IC is put in opposition to the parts mounting surface of the substrate matrix 11, then the bump electrodes 8 of the chip IC and the bump base metal patterns 15a of the substrate matrix 11 are aligned with each other, and in this state the chip ICs are mounted onto the substrate matrix 11 (Step 107 in FIG. 1). Then, the substrate matrix 11 is subjected to reflow treatment to melt the bump electrodes 8 and bond them to the bump base metal patterns 15a (Step 108 in FIG. 1), followed by washing, baking for dehumidifying, and plasma cleaning in this order (Steps 109-111 in FIG. 1). Although in the illustrated example one chip IC is mounted in each unit product region UDR, plural chip ICs may be mounted side by side in each unit product region UDR.

Next, a description will be given about the molding step for chip ICs with reference to FIGS. 16 to 19 (Steps 112 and 113 in FIG. 1). In this first embodiment there is adopted an MAP (Mold Array Package) method wherein the plural chip ICs mounted on the substrate matrix 11 are molded all together. FIGS. 16 to 19 are sectional views of a molding apparatus 17 used in the molding step and the substrate matrix 11.

Figure 16:
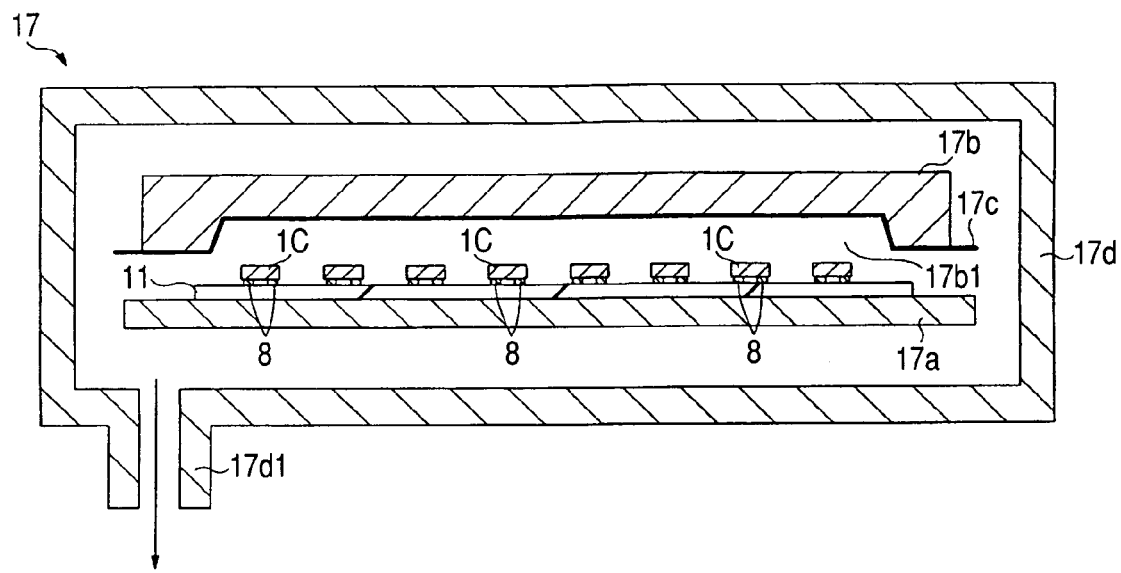
FIG. 16 is a sectional view of a molding die and the wiring substrate matrix in a manufacturing step which follows the step of FIG. 13.

First, as shown in FIG. 16, the substrate matrix 11 with the plural chip ICs mounted thereon is placed on a lower die 17a of the molding apparatus 17 in a state in which the parts mounting surface of the substrate matrix 11 faces up. At this time, planar relative positions of the substrate matrix 11 and the lower die 17a are aligned by inserting guide pins of the lower die 17a into the guide holes GH of the substrate matrix 11. The illustrated molding apparatus 17 includes the lower die 17a, an upper die 17b, a laminate film 17c, and a vacuum chamber 17d. A concave portion formed in a molding surface (the surface opposed to the lower die 17a) of the upper die 17b is an upper die cavity 17b1. The upper die cavity 17b1 is a molding region of sealing resin on the supper die 17b side and is formed in such a size as permits sealing the plural chip ICs on the substrate matrix 11 all together. The laminate film 17c is an insulating film formed of a soft and highly heat-resistant material such as, for example, a fluorine-based resin and is interposed between the lower die 17a and the upper die 17b of the molding apparatus 17. The laminate film 17c has such a planar size as can cover substantially the whole of an inner wall surface of the upper die cavity 17b1 formed in the upper die 17b. The laminate film 17c is adapted to be taken up by a take-up reel. As to an example of construction of the molding apparatus 17, a description will be given later.

Next, with the molding die (the lower die 17a and the upper die 17b) of the molding apparatus open, the gas present within the vacuum chamber 17d is exhausted through an exhaust pipe 17d1 to bring the interior of the vacuum chamber 17d (i.e., the interior of the cavity) into a vacuum condition (pressure-reduced condition). At this time, the internal pressure of the vacuum chamber 17d is set at, for example, about 133.322 Pa (=1 Torr). Further, the substrate matrix 11 is preheated from the standpoint of suppressing deformation of the substrate matrix 11 caused by heat. In this preheating treatment, the temperature of the lower die 17a is set at, for example, a temperature of about 175° to 180° C. and the treatment time is, for example, about 20 seconds. Thereafter, the temperature of the lower die 17a and that of the upper die 17b are set at about 175° to 180° C. and then the laminate film 17c is vacuum-sucked to toward the upper die 17b and is brought into close contact with the molding surface of the upper die 17b including the surface of the upper die cavity 17b1.

Figure 17:
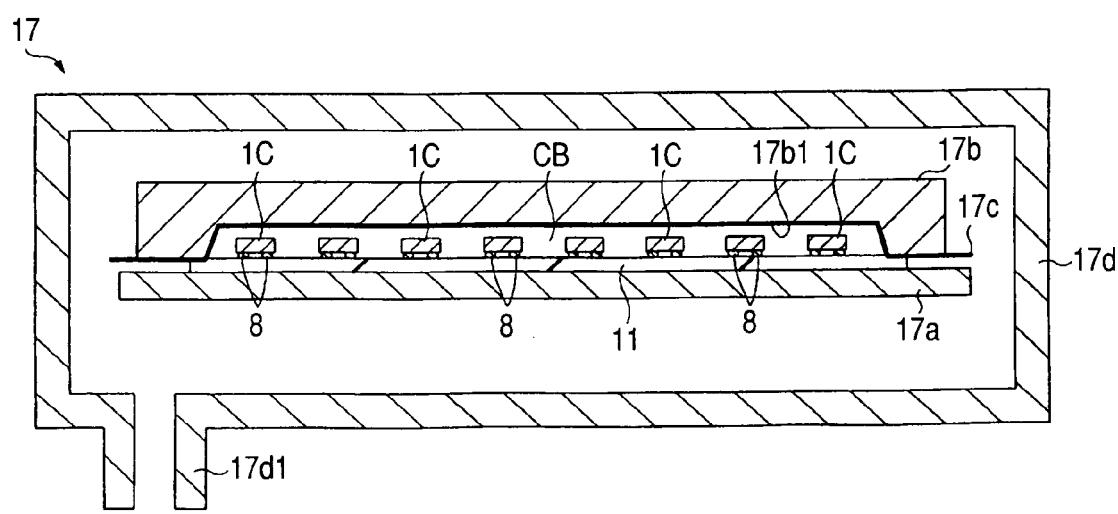
FIG. 17 is a sectional view of the molding die and the wiring substrate matrix in a manufacturing step which follows the step of FIG. 16.
Figure 18:
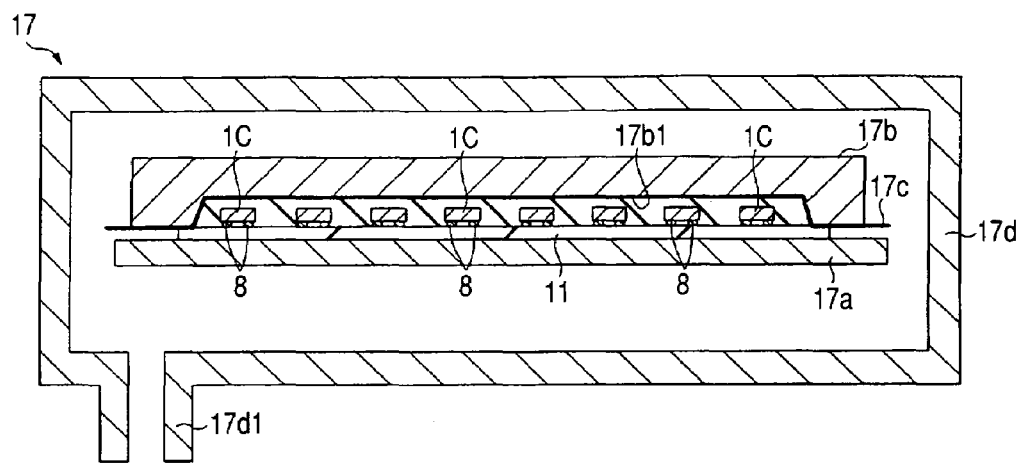
FIG. 18 is a sectional view of the molding die and the wiring substrate matrix in a manufacturing step which follows the step of FIG. 17.

Next, as shown in FIG. 17, the substrate matrix 11 is clamped so as to be sandwiched by both the lower die 17a and the upper die 17b. At this time, the outer periphery portion of the substrate matrix 11 is pushed and somewhat crushed against the outer periphery portion of the upper die cavity 17b1 of the upper die 17b through the laminate film 17c. In this way there is formed a cavity CB surrounded by both the surface of the upper die cavity 17b1 and the parts mounting surface of the substrate matrix 1. Thereafter, while the degree of vacuum in the interior of the vacuum chamber 17d, the temperature of the lower and upper dies 17a, 17b and the vacuum suction for the laminate film 17c are maintained, a thermosetting sealing resin such as, for example, an epoxy resin is injected into the cavity CB to seal the plural chip ICs on the main surface of the substrate matrix 11 all together. Thus, as shown in FIG. 18, a block sealing body 18 which encloses therein the plural chip ICs is formed on the main surface side of the substrate matrix 11 (Step 112 in FIG. 1).

According to this first embodiment, in the molding step, the interior of the cavity CB is brought into a state of reduced pressure, allowing the gas present in the interior of the cavity CB to escape to the exterior, whereby it is possible to suppress the formation of voids on the back sides of the chip ICs in the cavity CB and in the gap between the chip ICs and the substrate matrix 11. However, even if the interior of the cavity CB is maintained in a state of reduced pressure, if the thickness of the substrate matrix 11 varies within the range of tolerance, molding cannot be done to a satisfactory extent. For example, if a substrate matrix 11 having a thickness falling under the range of tolerance but thicker than a preset value is placed within the molding die, the air vents of the molding apparatus 17 are closed with a part of the substrate matrix 11 and the laminate film 17c, resulting in that it becomes impossible to let the gas present within the cavity CB escape to the exterior in a satisfactory manner. Consequently, voids may be formed on the back sides of the chip ICs within the cavity CB and in the gap between the chip ICs and the substrate matrix 11. Particularly, since the gap between the chip ICs and the substrate matrix 11 tends to become more and more narrow, voids are apt to be formed therein. If voids are formed on the back sides of the chip ICs within the cavity CB, the package appearance become poor. If voids are formed in the gap between the chip ICs and the substrate matrix 11, the bump electrodes 8 melt in the subsequent heat treatment and adjacent bump electrodes 8 are shorted through the voids, or the bump electrodes 8 are apt to be disconnected by a stress induced for example by deformation of the substrate matrix 11. Consequently, the yield of the semiconductor device is deteriorated. On the other hand, when molding is performed while setting the clamping pressure for the substrate matrix 11 low so as to ensure air vents, if a substrate matrix 11 thinner than the preset value within the range of tolerance is placed within the molding die, the amount of opening of each air vent is ensured a larger amount than necessary, so that the sealing resin leaks to the exterior from the air vents, and with the leaking sealing resin, the substrate matrix 11 after the molding can no longer be conveyed automatically, with a consequent lowering in productivity of the semiconductor device.

In view of these points, in the molding step carried out in this first embodiment, not only the interior of the cavity CB is brought into a state of reduced pressure as noted above, but also the clamping pressure for the substrate matrix 1 is changed from low to high as will be described later (two-stage clamping). By so doing, even if the thickness of the substrate matrix 11 varies within the range of tolerance, voids are not formed in the product regions DR within the cavity CB and in the gap between the chip ICs and the substrate matrix 11. Further, there is no likelihood of leakage of the sealing resin from the air vents, and the plural flip-chip mounted chip ICs can be sealed all together. Therefore, it is possible to improve the yield and productivity of the semiconductor device. In this first embodiment, moreover, since the plural flip-chip mounted chip Ics can be sealed all together without any inconvenience as noted above, the semiconductor device manufacturing time can be shortened and the productivity of the semiconductor device can be improved in comparison with the technique of injecting an under-fill material for each chip IC. Besides, the material cost of the sealing resin used in block molding is about one tenth of that of the under-fill material and is thus much lower. Thus, the cost of the semiconductor device which adopts the flip-chip mounting method can be greatly reduced. According to the present inventor, for example the cost of the semiconductor device adopting the flip-chip mounting method could be reduced to about half of that using an under-fill material.

Figure 19:
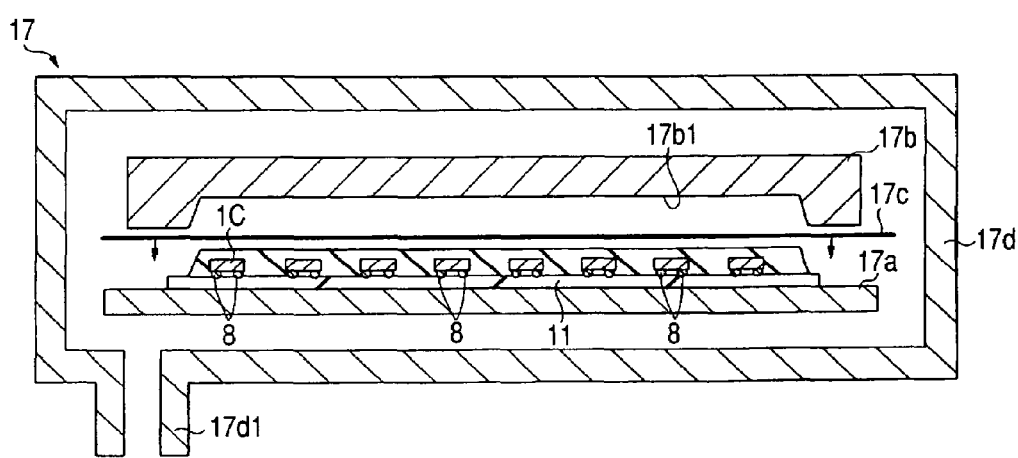
FIG. 19 is a sectional view of the molding die and the wiring substrate matrix in a manufacturing step which follows the step of FIG. 18.

Subsequently, the sealing resin is subjected to baking to cure (Step 113 in FIG. 1) and thereafter the substrate matrix 11 is released from the upper die 17b. In this case, while the temperature of the lower die 17a is held at the foregoing temperature and the internal pressure of the vacuum chamber 17d is released to the atmospheric pressure, the vacuum suction for the laminate film 17c is stopped and the substrate matrix 11 is released from the upper die 17b by utilizing the tension of the laminate film 17c, as shown in FIG. 19. At this time, the laminate film 17c is interposed between the inner wall surface of the upper die cavity 17b1 and the surface of the block sealing body 18 without direct contact between the upper die 17b and the block sealing body 18, and force is applied not to surface points but to the surface of the block sealing body 18. Consequently, with a relatively small force, the substrate matrix 11 can be released from the upper die 17b. Of course, there may be used a molding die of a construction not using the laminate film 17c but using ejector pins for releasing the substrate matrix 11 after the molding.

Figure 20:
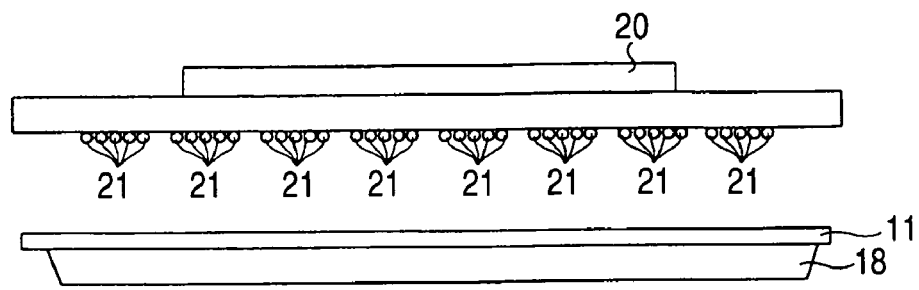
FIG. 20 is a side view of the wiring substrate matrix in a bump transfer step which follows the step of FIG. 19.
Figure 21:
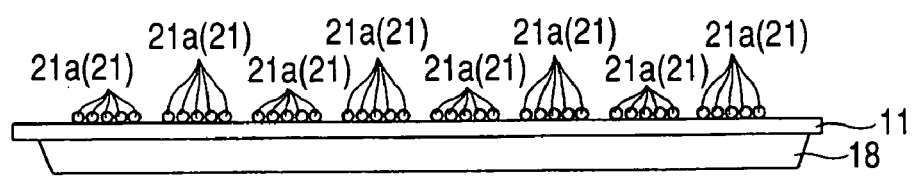
FIG. 21 is a side view of the wiring substrate matrix in a bump transfer step which follows the step of FIG. 20.
Figure 22:
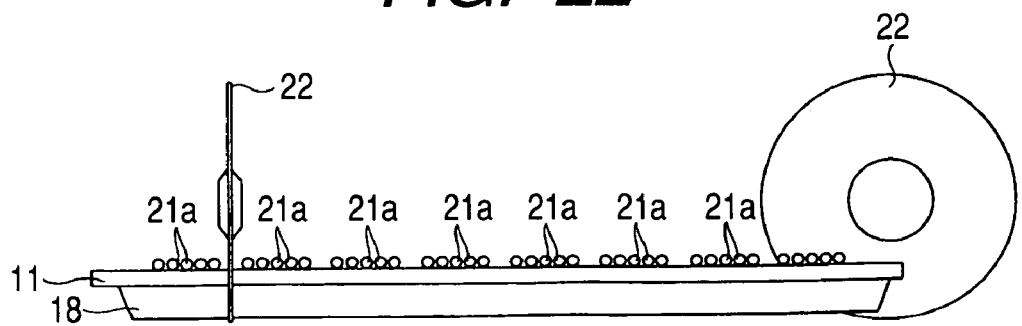
FIG. 22 is a side view of the wiring substrate matrix in a cutting step which follows the step of FIG. 21.

Next, a bump transfer step up to a cutting step will be described with reference to FIGS. 20 to 22 (Steps 114 to 117 in FIG. 1). FIGS. 20 and 21 are side views of the substrate matrix 11, etc. in the bump transfer step and FIG. 22 is a side view of the substrate matrix 11 in the cutting step.

First, as shown in FIG. 20, plural spherical solder bumps 21 held by a bump holding tool 20 are dipped into a flux vessel, allowing the surfaces of the solder bumps 21 to be coated with flux. Thereafter, the plural solder bumps 21 are temporarily bonded simultaneously to the bump base metal patterns 15b on the bump electrodes-forming surface of the substrate matrix 11 by utilizing the adhesive force of the flux (Step 114 in FIG. 1). The solder bumps 21 are formed of lead (Pb)/tin (Sn) solder for example. As the material of the solder bumps 21 there may be used a lead-free solder such as, for example, tin/silver (Ag) solder. The solder bumps 21 may be connected all together for each unit product region UDR, but from the standpoint of improving the throughput of the solder bump transfer step it is preferable that solder bumps 21 for plural unit product regions UDR be connected at a time. Subsequently, the solder bumps 21 are subjected to reflow under heating at a temperature of 220° C. or so for example to fix them to the bump base metal patterns 15b and form bump electrodes (protrude electrodes) 21a (Step 115 in FIG. 1). Thereafter, flux residue, etc. on the surface of the substrate matrix 11 are removed using a synthetic detergent, whereby the solder bump transfer step is completed (Step 116).

Figure 23:
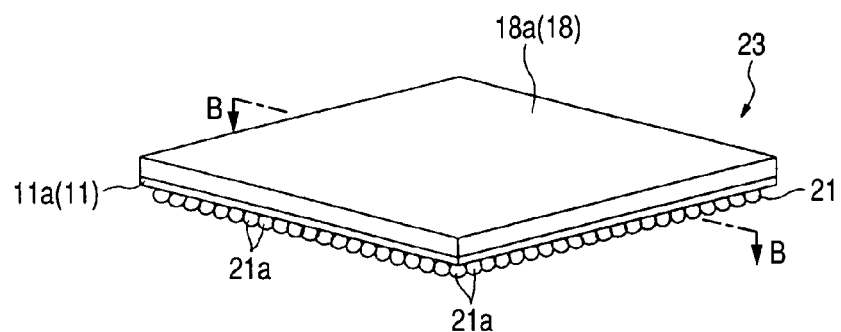
FIG. 23 is a perspective view of a semiconductor device cut out in the cutting step of FIG. 22.
Figure 24:
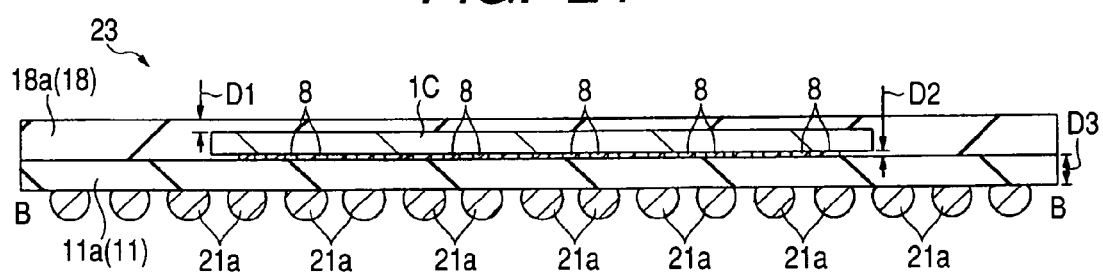
FIG. 24 is a sectional view taken on line B-B in FIG. 23.

Next, the substrate matrix 11 is turned upside down and the block sealing body 18 on the parts mounting surface side of the substrate matrix 11 is fixed firmly with an adhesive tape or the like. Subsequently, as shown in FIG. 22, in the same manner as in the dicing step for the wafer 1W, the substrate matrix 11 and the block sealing body 18 are cut using a dicing blade 22 from the back side of the substrate matrix 11 (Step 117 in FIG. 1). As a result, plural semiconductor devices 23 of, for example, a BGA (Ball Grid Array) package type are obtained simultaneously, as shown in FIGS. 23 and 24. FIG. 23 is a perspective view of a semiconductor device 23 thus obtained and FIG. 24 is a sectional view taken on line B-B in FIG. 23. A wiring substrate 11a is a member obtained by cutting the substrate matrix 11. Chip ICs are mounted on a parts mounting surface of the wiring substrate 1a through bump electrodes 8. A sealing body 18a which covers the chip ICs is a member obtained by cutting the block sealing body 18. On the other hand, bump electrodes 21a are connected to a bump electrodes-forming surface of the wiring substrate 11a. The bump electrodes 21a are bonded to the bump base metal patterns 15b and are arranged at lattice-like intersecting points on the bump electrodes-forming surface of the wiring substrate 11a.

Figure 25:
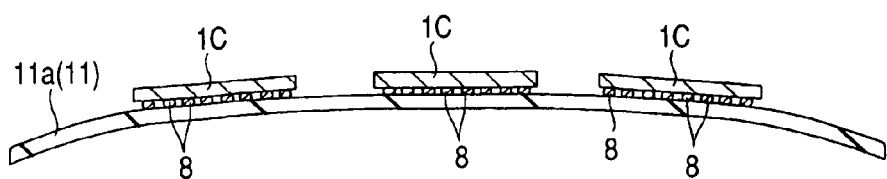
FIG. 25 is a sectional view of the wiring substrate matrix for explaining warp of the wiring substrate matrix after the mounting of semiconductor chips thereon.
Figure 26:
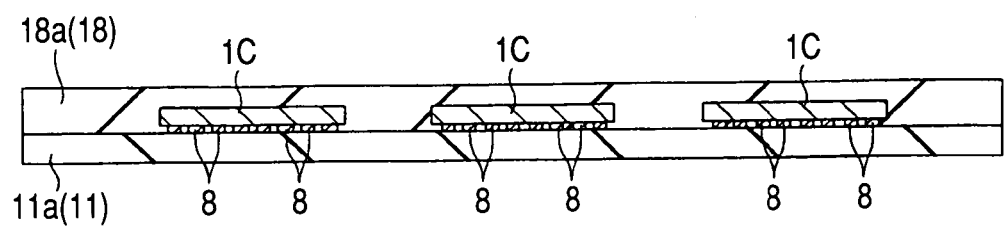
FIG. 26 is a sectional view of the semiconductor substrate matrix, showing a state in which the warp of the wiring substrate matrix shown in FIG. 25 has been remedied by the construction of a block sealing body.

In this first embodiment the semiconductor device 23 is formed so that the thickness D1 of the sealing body 18a on the back side of the chip IC is larger than the length D2 of the gap between the chip IC and the wiring substrate 11a (i.e., the thickness of the sealing body 18a charged into the gap) and smaller than the thickness D3 of the wiring substrate 11a (substrate matrix 11). More particularly, the length D2 is, for example, about 100 μm and the thickness D1 is, for example, about 200 μm which is twice the length D2. Filler, e.g., silica, is contained in the sealing body 18a, but the content of the filler is set rather low and a linear expansion coefficient of the sealing body 18a (the block sealing body 18) is high. A linear expansion coefficient of the sealing body 18 (the block sealing body 18) is higher than that of the wiring substrate 11a (substrate matrix 11). This construction is for the following reason. When chip ICs are mounted on the substrate matrix 11, as shown in FIG. 25, the substrate matrix 11 may be warped so that the parts mounting surface side is convex and the bump electrodes-forming surface side is concave, due to the difference in linear expansion coefficient between the chip ICs and the substrate matrix 11. If the warp of the substrate matrix 11 is large after molding the chip ICs with sealing resin as described above, the sealing body 18a may be chipped in the cutting step (Step 117 in FIG. 1) of the substrate body 11 and the block sealing body 18, with a consequent lowering of yield, or when each semiconductor device 23 thus cut out is mounted onto a wiring substrate such as a printed wiring board, there may occur a defective connection between the semiconductor device 23 and the wiring substrate due to warping of the semiconductor device 23. The problems of defective connection between the semiconductor device 23 and the wiring substrate becomes more marked as the size of the semiconductor device 23 becomes larger. On the other hand, according to the above construction of this first embodiment, the thickness D1 of the sealing body 18a on the back side of each chip IC is larger than the length D2 of the gap between the chip IC and the wiring substrate 11a, and the linear expansion coefficient of the sealing body 18a (the block sealing body 18) is set higher than that of the wiring substrate 11a (substrate matrix 11), whereby the warp of the substrate matrix 11 can be remedied as in FIG. 26. Consequently, it is possible to diminish or prevent the occurrence of chipping in the sealing body 18a in the cutting step (Step 117 in FIG. 1) and hence possible to improve the yield of the semiconductor device 23. It is also possible to diminish warping of the semiconductor device 23 after being cut out from the substrate matrix 11. Therefore, the defective connection at the time of mounting the semiconductor device 23 can also be diminished or prevented. Moreover, since the amount of filler contained in the block sealing body 18 is made rather small as described above, it is possible to diminish the probability of occurrence of such an inconvenience as the filler obstructs the flow of the sealing resin about to enter the gap between the chip IC and the substrate matrix 11 in the molding step and also possible to diminish the probability of occurrence of such an inconvenience as the filler closes the air vents. Accordingly, the probability of occurrence of voids can be made still lower. Further, if the thickness D1 of the back side of each chip IC is made too large, the semiconductor device 23 becomes thicker, thus obstructing the reduction in size and thickness of the semiconductor device 23. In this first embodiment, therefore, the thickness D1 is set smaller than the thickness D3 of the wiring substrate 11a (substrate matrix 11), whereby it is possible to reduce the thickness of the semiconductor device 23.

The following description is now provided about an example of a molding equipment having the molding apparatus 17 described above.

Figure 27:
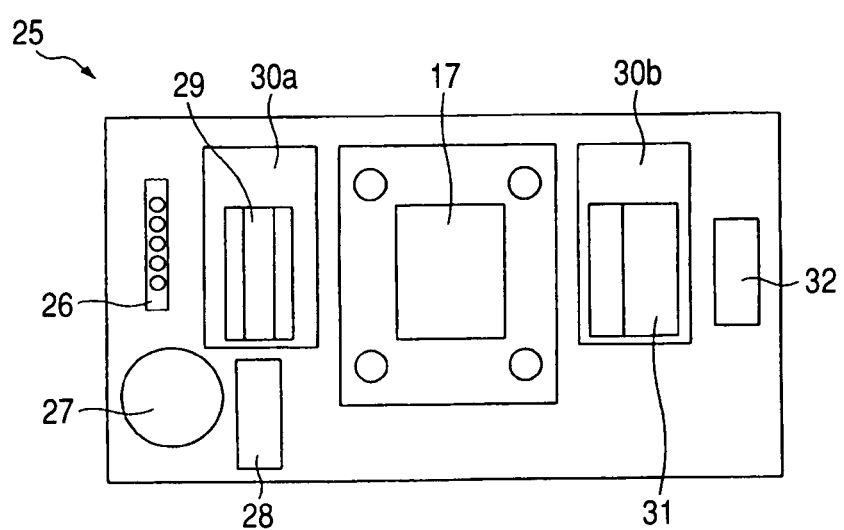
FIG. 27 illustrates an example of an automatic molding equipment used in the semiconductor device manufacturing process of the embodiment.

FIG. 27 shows an example of an automatic molding equipment 25. The automatic molding equipment 25 comprises a tablet arraying section 26, a tablet parts feeder 27, a substrate loader 28, a substrate arraying section 29, a carrying-in section 30a, the molding apparatus 17, a gate break section 31, a carrying-out section 30b, and a substrate unloader 32. The substrate matrix 11 after the flip-chip mounting step and before molding is accommodated within the automatic molding equipment 25 through the substrate loader 28 and is arrayed in the substrate arraying section 29, then is placed on the lower die in the molding apparatus 17 through the carrying-in section 30a. The substrate matrix 11 after having gone through the molding step in the molding apparatus 17 is conveyed to the gate break section 31, in which resin remaining in resin inlet ports is removed. The substrate matrix 11 is then conveyed through the carrying-out section 30b to the substrate unloader 32, in which it is taken out to the exterior.

Figure 28:
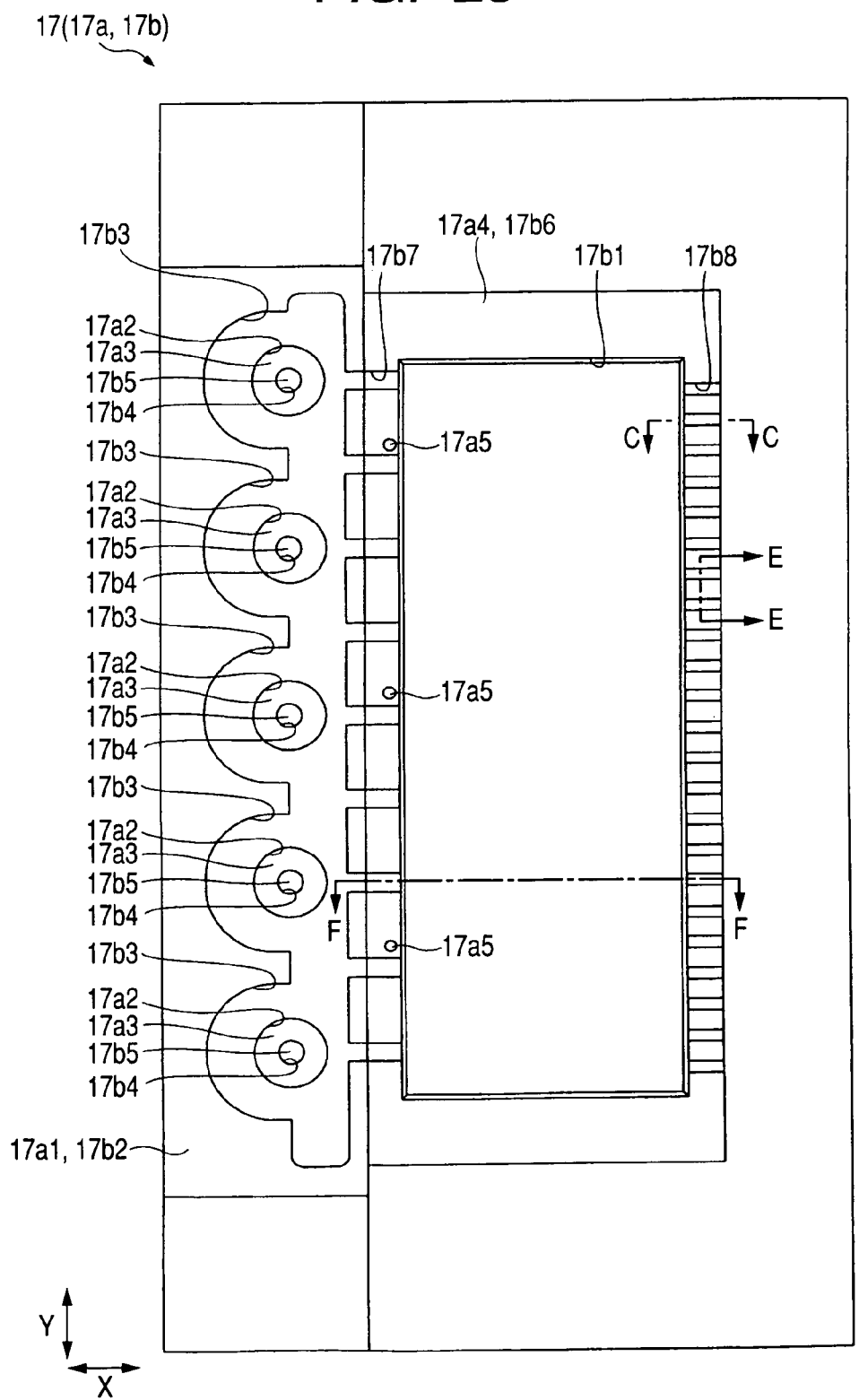
FIG. 28 is a plan view of a molding die used in the automatic molding apparatus of FIG. 27, showing a lower die and an upper die of the molding die in a mutually superimposed state.
Figure 29:
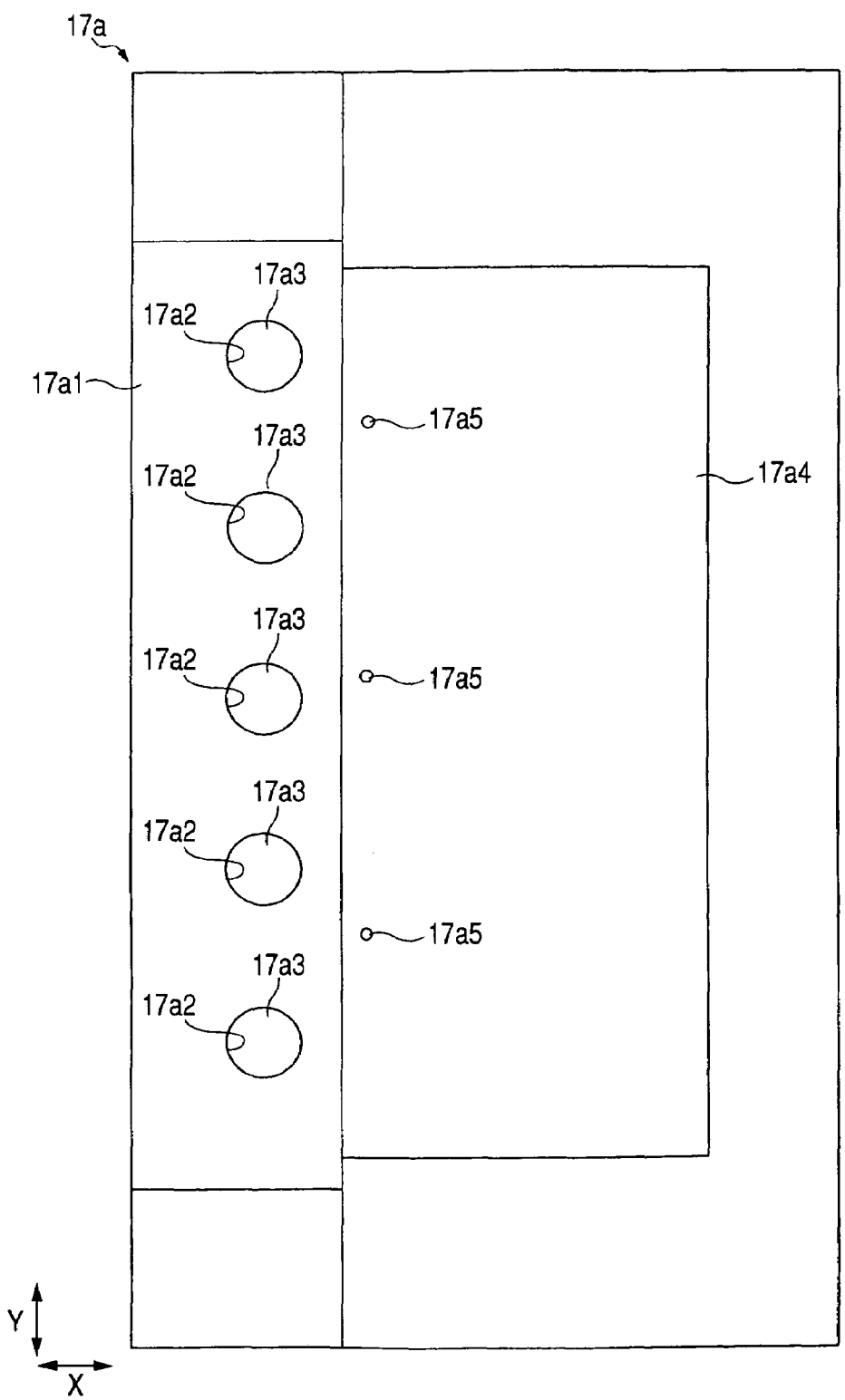
FIG. 29 is a plan view of a molding surface of the lower die shown in FIG. 28.
Figure 30:
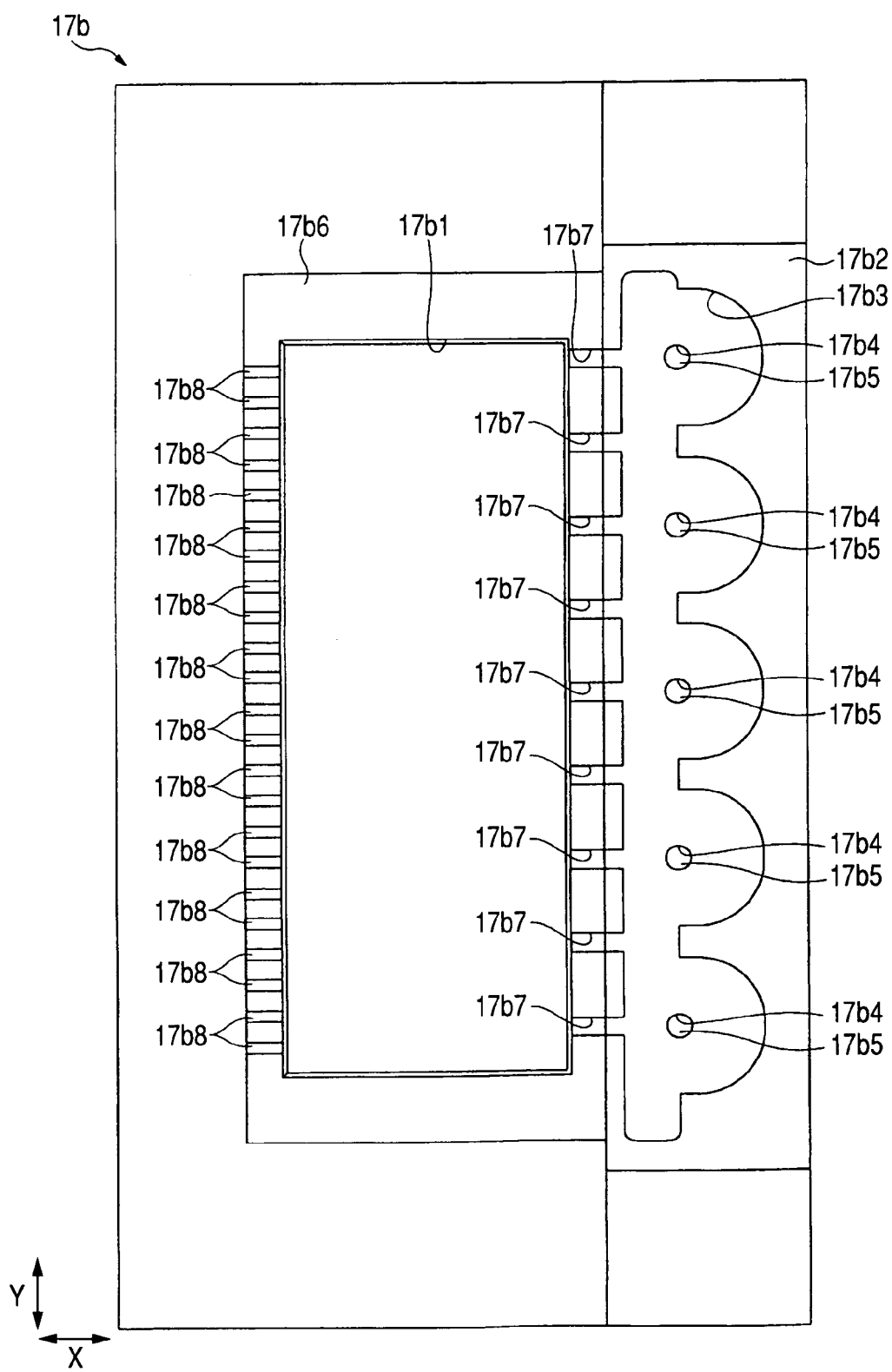
FIG. 30 is a plan view of a molding surface of the upper die shown in FIG. 28.
Figure 31:
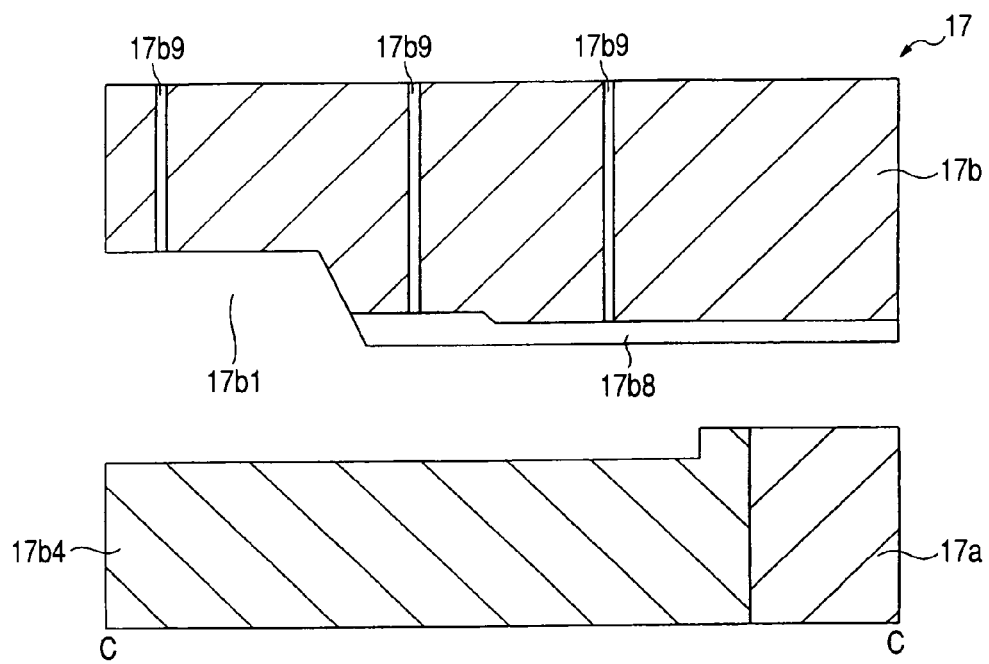
FIG. 31 is a sectional view taken on line C-C in FIG. 28.
Figure 32:
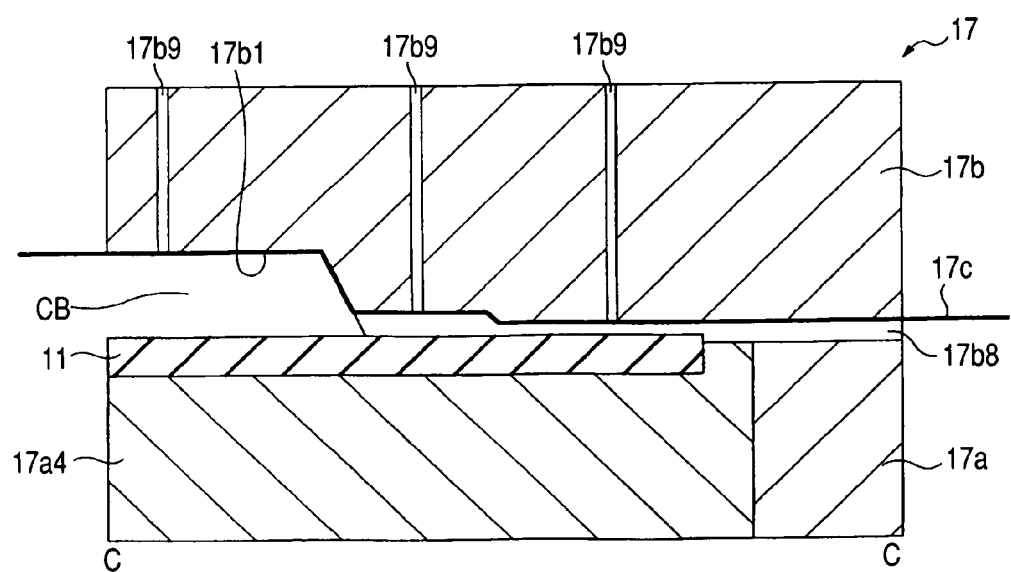
FIG. 32 is a sectional view taken on line C-C in FIG. 28 in a clamped state of the wiring substrate matrix.
Figure 33:
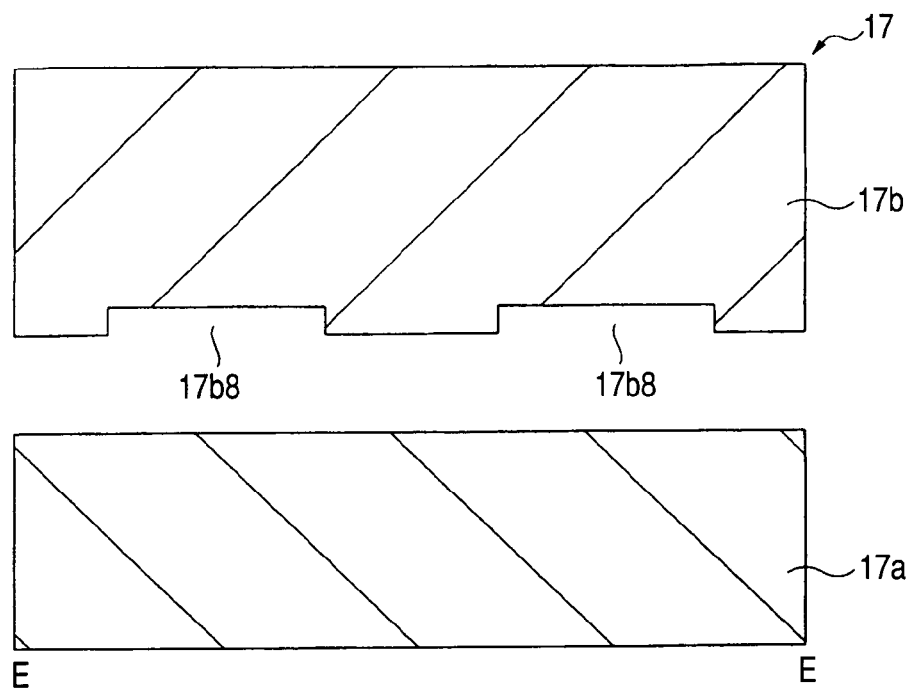
FIG. 33 is a sectional view taken on line E-E in FIG. 28.
Figure 34:
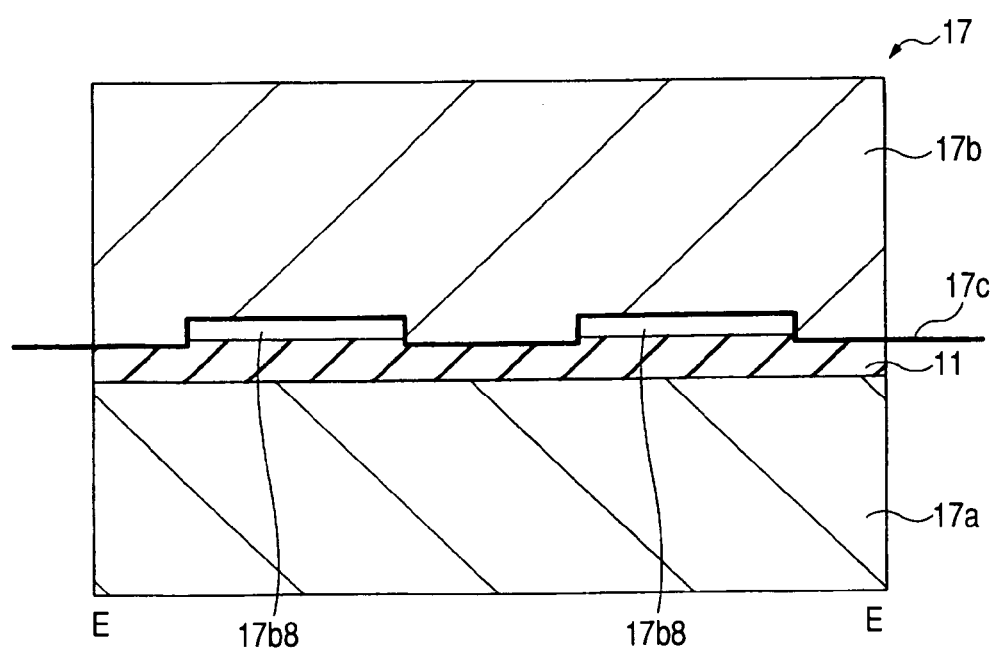
FIG. 34 is a sectional view taken on line E-E in FIG. 28 in a clamped state of the wiring substrate matrix.

Next, a construction example of the molding apparatus 17 in the automatic molding equipment 25 will be described with reference to FIGS. 28 to 34. FIG. 28 is a plan view of the lower die 17a and the upper die 17b of the molding apparatus 17 in a mutually superimposed state, FIG. 29 is a plan view of a molding surface of the lower molding die 17a shown in FIG. 28, FIG. 30 is a plan view of a molding surface of the upper die 17b shown in FIG. 28, FIG. 31 is a sectional view taken on line C-C in FIG. 28, FIG. 32 is a sectional view taken on line C-C in FIG. 28 in a clamped state of the substrate matrix 11, FIG. 33 is a sectional view taken on line E-E in FIG. 28, and FIG. 34 is a sectional view taken on line E-E in FIG. 28 in a clamped state of the substrate matrix 11. The mark X represents a first direction and the mark Y represents a second direction orthogonal to the first direction.

A pot holder 17a1 is disposed on the left side in the first direction X of a molding surface (the surface opposed to the upper die 17b) of the lower die 17a. In the pot holder 17a1, plural pots 17a2 are arranged side by side at desired intervals in the second direction Y. The pots 17a2 are molding material supply ports, and plungers 17a3 are arranged in the pots 17a2 respectively. The plungers 17a3 are constituent portions for injecting a molding material present in the pots 17a2 into the cavity CB and holding it in a pressurized state. Low plungers are illustrated in the figure.

On one side of the pot holder 17a1 on the molding surface of the lower die 17a is disposed a lower die cavity base 17a4. The substrate matrix 11 after mounting the chip ICs thereon is put on the lower die cavity base 17a4. Plural guide pins 17a5 are provided on the lower die cavity base 17a at positions near and along one long side of the molding surface. Positioning of the matrix substrate 11 is effected by inserting the guide pins 17a5 into the guide holes GH formed in the substrate matrix. Although the molding apparatus 17 having a molding section on only one side of the pot holder 17a1 is here described, no limitation is made thereto. For example, there may be used a molding apparatus 17 having molding sections on both right and left sides of the pot holder 17a1. In this case, a single molding step permits molding of two substrate matrices 11.

A cull block 17*b*2 is disposed on the molding surface of the upper die 17*b* at a position opposed to the pot holder 17*a*1 of the lower die 17*a*. Grooves 17*b*3 for cull and runner are formed in the cull block 17*b*2 in an extended state in the second direction Y. Plural apertures 17*b*4 are formed in the grooves 17*b*3 at predetermined intervals in the second direction Y and ejector pins 17*b*5 are partially exposed from the apertures 17*b*4. The ejector pins 17*b*5 are for release of resin remaining in culls and runners from the upper die 17*b* and are arranged movably in a direction perpendicular to the molding surface of the upper die 17*b*.

An upper die cavity block 17*b*6 is installed at a position adjacent to the cull block 17*b*2 of the upper die 17*b* and opposed to the lower cavity base 17*a*4 of the lower die 17*a*. An upper die cavity 17*b*1 is formed nearly centrally of the upper die cavity block 17*b*6. A planar size of the upper die cavity 17*b*1 is larger than that of the product region DR of the substrate matrix 11. Its size in the first direction X is, for example, about 60 mm and its size in the second direction Y is, for example, about 148 mm. The depth of the upper die cavity 17*b*1 is, for example, 0.45 mm.

Between the upper die cavity 17*b*1 and the grooves 17*b*3 are formed plural gates 17*b*7 so as to provide connection between the cavity and the grooves. The gates 17*b*7 are inlet ports used when molten sealing resin flowing toward the gates from the grooves 17*b*3 is allowed to flow into the cavity CB. Further, plural air vents 17*b*8 are formed in the other long side of the upper die cavity 17*b*1 so as to extend in a direction away from the upper die cavity 17*b*1. The air vents 17*b*8 are for discharging gas from the resin-filled portion to the exterior when sealing resin is injected into the upper die cavity 17*b*1. The depth of each air vent 17*b*8 is about 40 μm for example. By thus forming plural air vents 17*b*8 it is possible to discharge gas from the resin-filled portion to the exterior in a satisfactory manner when injecting resin and it becomes possible to inject the sealing resin into the cavity CB in a satisfactory manner. In FIGS. 32 and 34 there is shown a state in which the substrate matrix 11 and the laminate film 17*c* partially get into the air vents 17*b*8 when clamping the substrate matrix 11. Vacuum suction holes 17*b*9 are formed in the upper die 17*b*. The laminate film 17*c* is vacuum-sucked through the vacuum suction holes 17*b*9 and are brought into close contact with the molding surface of the upper die 17*b*.

Figure 35:
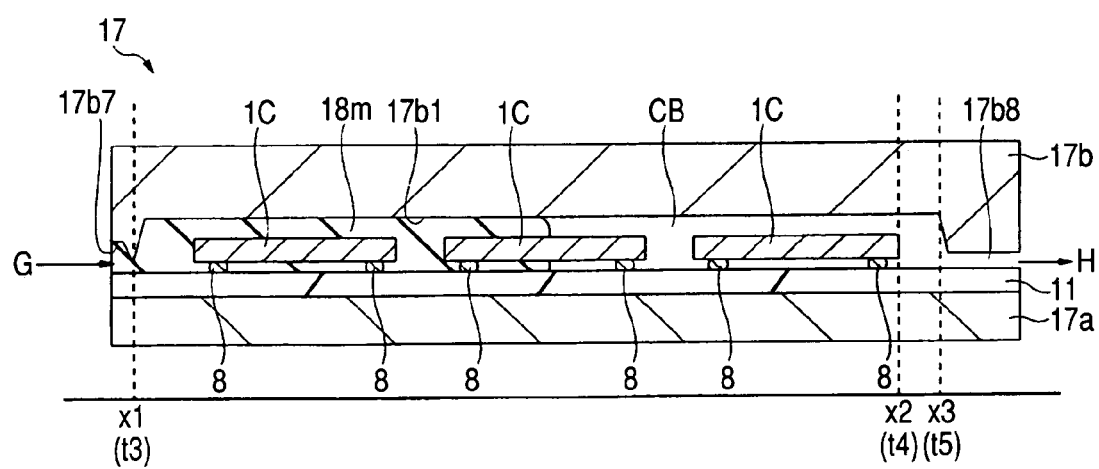
FIG. 35 is a sectional view taken on line F-F in FIG. 28 of the molding die in a molding step.

A molding method for plural chip ICs in this first embodiment will now be described with reference to FIGS. 35 to 37. FIG. 35 is a sectional view taken on line F-F in FIG. 28 of the molding apparatus 17 in the molding step and FIG. 36 is an operation chart in the molding step.

Figure 36:
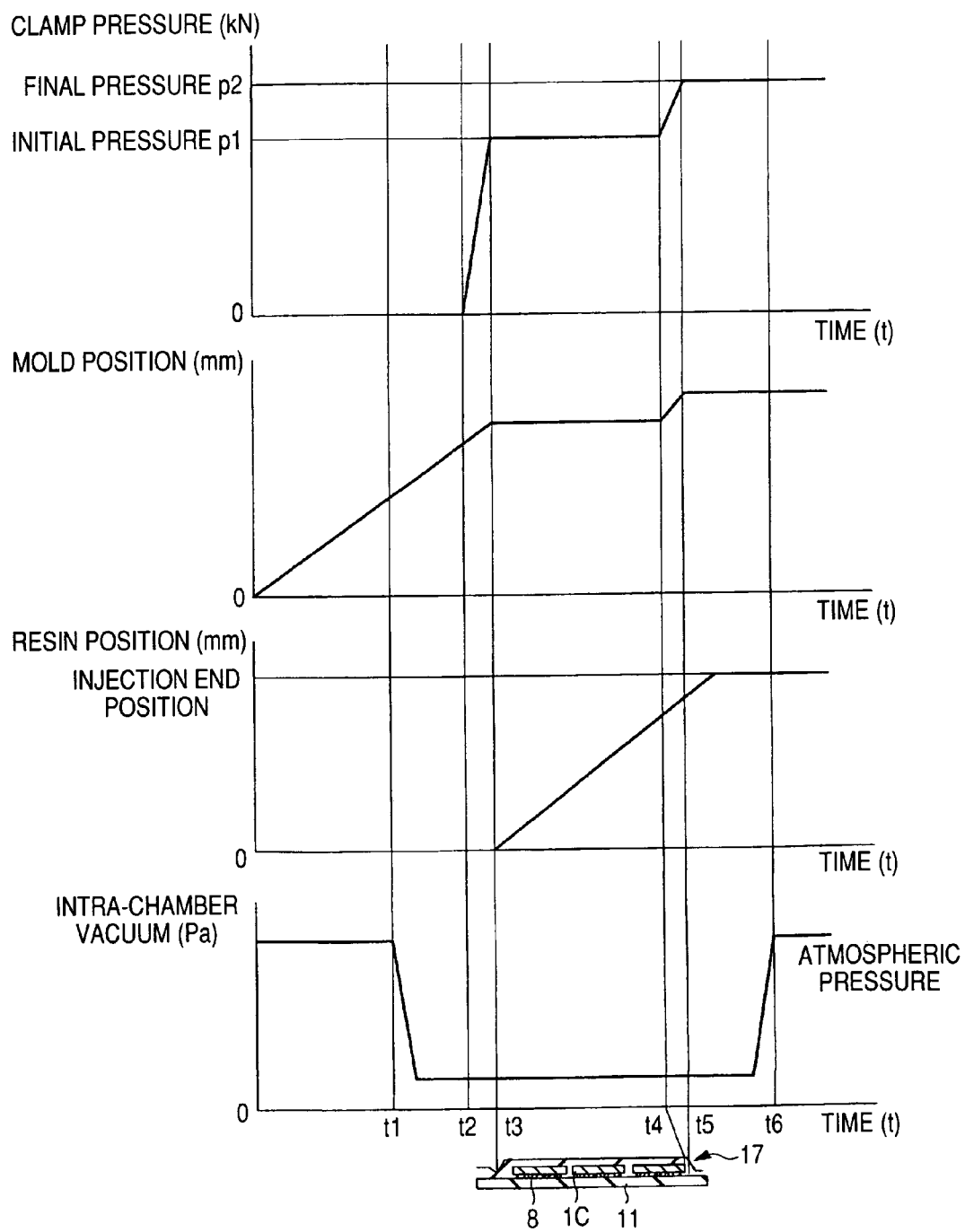
FIG. 36 is an operation chart in the molding step using the molding die shown in FIG. 28.

Position coordinates are illustrated in FIG. 35 for showing a relation between a front end position of sealing resin 18*m* in a molten condition and time in the operation chart of FIG. 36. In FIG. 36, the mark G represents a direction of injection of the sealing resin 18*m* and the mark H represents a gas discharge direction of the gas present within the cavity CB. FIG. 36 shows time vs. operations of various portions. In the same figure, the top stage represents a clamping pressure for the substrate matrix 11, the stage which underlies the top stage represents the position of the molding die, the still lower stage represents a resin injecting position of the sealing resin 18*m*, and the bottom stage represents the degree of vacuum within the vacuum chamber 17*d*. The clamping pressure for the substrate matrix 11 is not a value of an actual pressure applied to the substrate matrix 11, but is a pressure which is presumed to be applied to the substrate matrix 11 at a relative position of the upper die 17*b* with respect to the substrate matrix 11. That is, the clamping pressure for the substrate matrix 11 is controlled by a relative position (distance) between the upper die 17*b* and the substrate matrix 11. The molding apparatus 17 is of the type in which the upper die 17*b* is fixed, while the lower die 17*a* is moved up and down. It follows that the clamp pressure for the substrate matrix 11 is controlled by the amount of vertical movement of the lower die 17*a*. Though not specially limited, the following description is based on the assumption that the thickness tolerance of the substrate matrix 11 is about ±50 to ±70, with an error being about ±15.

First, at time t1, the internal pressure of the vacuum chamber 17 is started to decrease while raising the lower die 17*a* so that the molding surface of the upper die 17*b* in the molding apparatus 17 approaches the parts mounting surface of the substrate matrix 11 gradually, and is set at, for example, about 133.322 Pa (=1 Torr). At time t1, the molding die is open with the lower die 17*a* and the upper die 17*b* being spaced from each other, and the injection of the sealing resin 18*m* into the cavity CB has not been started yet. The lower die 17*a* is continued to rise, then at time t2 at which the molding surface of the upper die 17*b* comes into abutment against the parts mounting surface of the substrate matrix 11, the lower die 17*a* is further raised about 20 μm for example, and the movement of the lower die 17*a* is stopped at an initial pressure (a first clamp pressure) p1 of the clamping pressure of both lower die 17*a* and upper die 17*b* for the substrate matrix 11. At this time, if the thickness of the substrate matrix 11 is a preset value, the upper die 17*b* sinks about 20 μm from the parts mounting surface of the substrate matrix 11, so that an aperture region of about 20 μm deep is allowed to remain in each of the air vents 17*b*8 of the upper die 17*b*. If the thickness of the substrate matrix 11 is larger about +15 μm than the preset value, the upper die 17*b* sinks about 35 μm from the parts mounting surface of the substrate matrix 11, so that an aperture region of about 5 μm is allowed to remain in each of the air vents 17*b*8 of the upper die 17*b*. Further, if the thickness of the substrate matrix 11 is smaller about −15 μm than the preset value, the upper die 17*b* sinks about 5 μm from the parts mounting surface of the substrate matrix 11, so that an aperture region of about 35 μm deep is allowed to remain in each of the air vents 17*b*8 of the upper die 17*b*. In all of the above cases related to the thickness of the substrate matrix 11, the gas present within the cavity CB can be allowed to escape to the exterior in a satisfactory manner because aperture regions in the air vents 17*b*8 are ensured. Thereafter, the internal pressure of the cavity CB is reduced and the clamping pressure for the substrate matrix 11 is set at the initial pressure p1. In this state, at time t3 (coordinates x1), injection of the sealing resin 18*m* into the cavity CB is started through the gates 17*b*7.

Then, the sealing resin 18*m* is injected continuously into the cavity CB while maintaining the internal pressure of the vacuum chamber 17*d* and the clamping pressure for the substrate matrix 11 at the above level, and at time t4 (coordinates x2) the lower die 17*a* is again started to rise, for example, rise about 20 μm. Then, at time t5 (coordinates x3 before arrival of the sealing resin 18*m* at the air vents 17*b*8) at which the clamping pressure for the substrate matrix 11 becomes the final pressure (second clamping pressure) p2, the rise of the lower die 17*a* is stopped. The time t4 is the time at which the sealing resin 18*m* covers the whole of the final stage chip ICs in the resin injecting direction G but does not reach the air vents 18*b*8. The time t5 is the time of coordinates x3 just before arrival of the sealing resin 18*m* at the air vents 17*b*8. The final pressure p2 is of a value capable of withstanding the injection pressure of the sealing resin 18m. At this time, if the thickness of the substrate matrix 11 is the preset value, the upper die 17b sinks about 40 μm from the parts mounting surface of the substrate matrix 11. If the thickness of the substrate matrix 11 is about +15 μm larger than the preset value, the upper die 17b sinks about 55 μm from the parts mounting surface of the substrate matrix 11. Therefore, in the case where the thickness of the substrate matrix is the preset value and also in the case where it is about +15 μm larger than the preset value, the air vents 17b8 formed in the upper die 17b are closed almost completely with part of the substrate matrix 1 and the laminate film 17d, so that it becomes impossible to let gas escape to the exterior, with formation of voids. However, since the voids are formed outside the product region DR, there occurs no special problem with the resulting products. Further, in the case where the thickness of the substrate matrix 11 is about −15 μm smaller than the preset value, the upper die 17b sinks about 25 μm from the parts mounting surface of the substrate matrix 11, so that aperture regions of about 15 μm are allowed to remain in the air vents 17b8 of the upper die 17b. In this case, since the aperture regions of the air vents 17b8 are ensured, the gas present within the cavity CB can be allowed to escape to the exterior in a satisfactory manner. Besides, in all of the above cases with respect to the thickness of the substrate matrix 11, it is not that the aperture regions of the air vents 17b8 are ensured excessively. Therefore, the sealing resin 18m does not leak from the air vents 17b8. Then, after the injection of the sealing resin 18m into the cavity CB is over, a shift is made to the step of taking out the substrate matrix 11 from the molding apparatus 17. Baking to cure is performed four about 2 minutes while maintaining the clamping pressure at the final pressure p2. During this treatment, at time t6, the internal pressure of the vacuum chamber 17d is released to the atmospheric pressure to complete the treatment.

Figure 46:
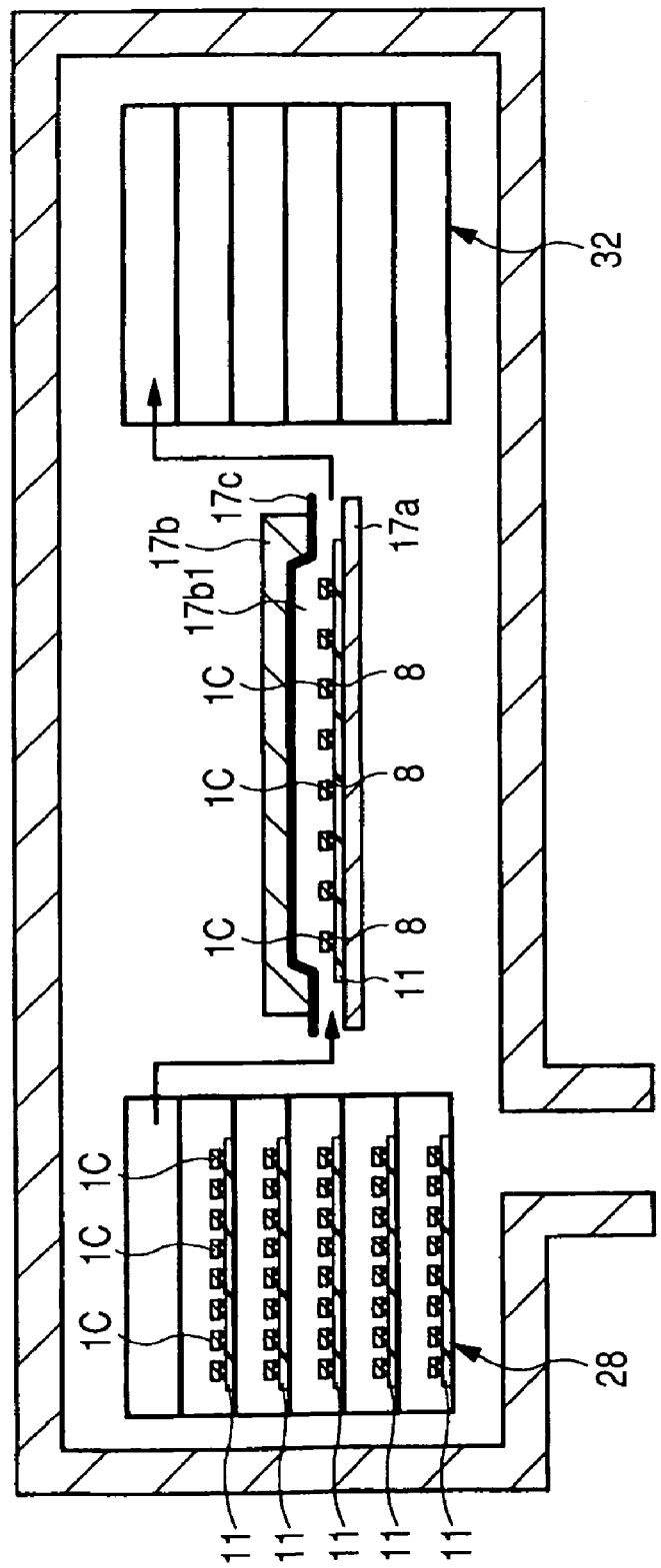
FIG. 46 illustrates another example of an automatic molding apparatus used in the semiconductor device manufacturing method embodying the present invention.

As shown in FIG. 46, a substrate loader 28 capable of supplying plural such substrate matrices 11 as described above to the molding die while holding the substrate matrices 11 and a substrate unloader 32 capable of discharging the plural substrate matrices 11 after sealed with resin from the molding die and holding them, are arranged in the vacuum chamber 17d within the molding apparatus 17, whereby the resin sealing step can be repeated plural times while maintaining the state of vacuum. Thus, the productivity can be further improved in comparison with the case where it is necessary to release the internal pressure of the vacuum chamber 17d to the atmospheric pressure at every resin sealing step.

Thus, in this first embodiment, not only the interior of the cavity CB is put in a state of reduced pressure, but also the clamping pressure for the substrate matrix 11 by the lower die 17a and the upper die 17b is changed from low to high when the position of the sealing resin 18m is at an intermediate position in the cavity CB (more specifically the position at which the final stage chip ICs in the resin injecting direction G are sealed), whereby the molding can be done in a satisfactory manner even if the thickness of the substrate matrix 11 varies within the range of tolerance. As noted above, in the case where the thickness of the substrate matrix 11 is larger than the preset value within the range of tolerance, if the clamping pressure for the substrate matrix 11 is set too high from the beginning, the air vents 17b8 are closed with the sinking portion of the substrate matrix 11 and the laminate film, making it impossible to let the gas present within the cavity CB escape to the exterior, with consequent formation of voids on the back sides of the chip ICs, especially in the gap between the chip ICs and the substrate matrix 11. On the other hand, in this first embodiment, the clamping pressure for the substrate matrix 11 is set low initially and molding is performed while ensuring apertures in the air vents 17b8, so that the gas present within the cavity CB can be allowed to escape to the exterior in a satisfactory manner. Therefore, even in the case where the substrate matrix 11 is thicker than the preset value within the range of tolerance, the sealing resin can be injected into the cavity CB without formation of voids in the product region DR within the cavity CB and in the gap between the chip ICs and the substrate matrix 11. Consequently, it is possible to improve the yield of the semiconductor device which adopts the flip-chip mounting method. FIG. 37 shows the number of voids formed in for example twenty-four semiconductor chips in a comparative manner. When pressure is not reduced and when such two-stage clamp as described above is not used, the number of voids formed is 3/27 in the gap between the chip ICs and the substrate matrix 11 and 8/27 on the back sides of the chip ICs. On the other hand, when pressure is reduced and when the two-stage clamp is used, the number of voids formed is 0/27 in the gap between the chip ICs and the substrate matrix 11 and 0/27 also on the back sides of the chip ICs.

In the case where the substrate matrix 11 is thinner than the preset value within the range of tolerance, if the clamping pressure for the substrate matrix 11 is kept low until the end, the aperture quantity in the air vents 17b8 is ensured to a larger extent than necessary, so that the sealing resin 18m leaks to the exterior from the air vents 17b8, and with the thus-leaking sealing resin 18m, it becomes impossible to automatically convey the substrate matrix 11 after the molding step. On the other hand, in this first embodiment, although the clamping pressure for the substrate matrix 11 is set low initially, it is raised from the initial pressure p1 to the final pressure p2 just before arrival of the sealing resin 18m at the air vents 17b8, whereby even when the substrate matrix 11 is thinner than the preset value within the range of tolerance, the aperture quantity remaining in the air vents 17b8 in the final stage of arrival of the sealing resin 18m at the air vents 17b8 can be prevented from becoming too large and hence it is possible to prevent the sealing resin 18m from leaking to the exterior through the air vents 17b8. Thus, it is possible to eliminate such an inconvenience as the substrate matrix 11 after molding can no longer be conveyed automatically due to leakage of the sealing resin 18m. Accordingly, it is possible to improve the productivity of the semiconductor device which adopts the flip-chip mounting method.

Second Embodiment

In this second embodiment a description will be given about the technique of molding plural chip ICs flip-chip mounted on a substrate matrix 11 with use of a molding die having movable air vents.

Figure 38:
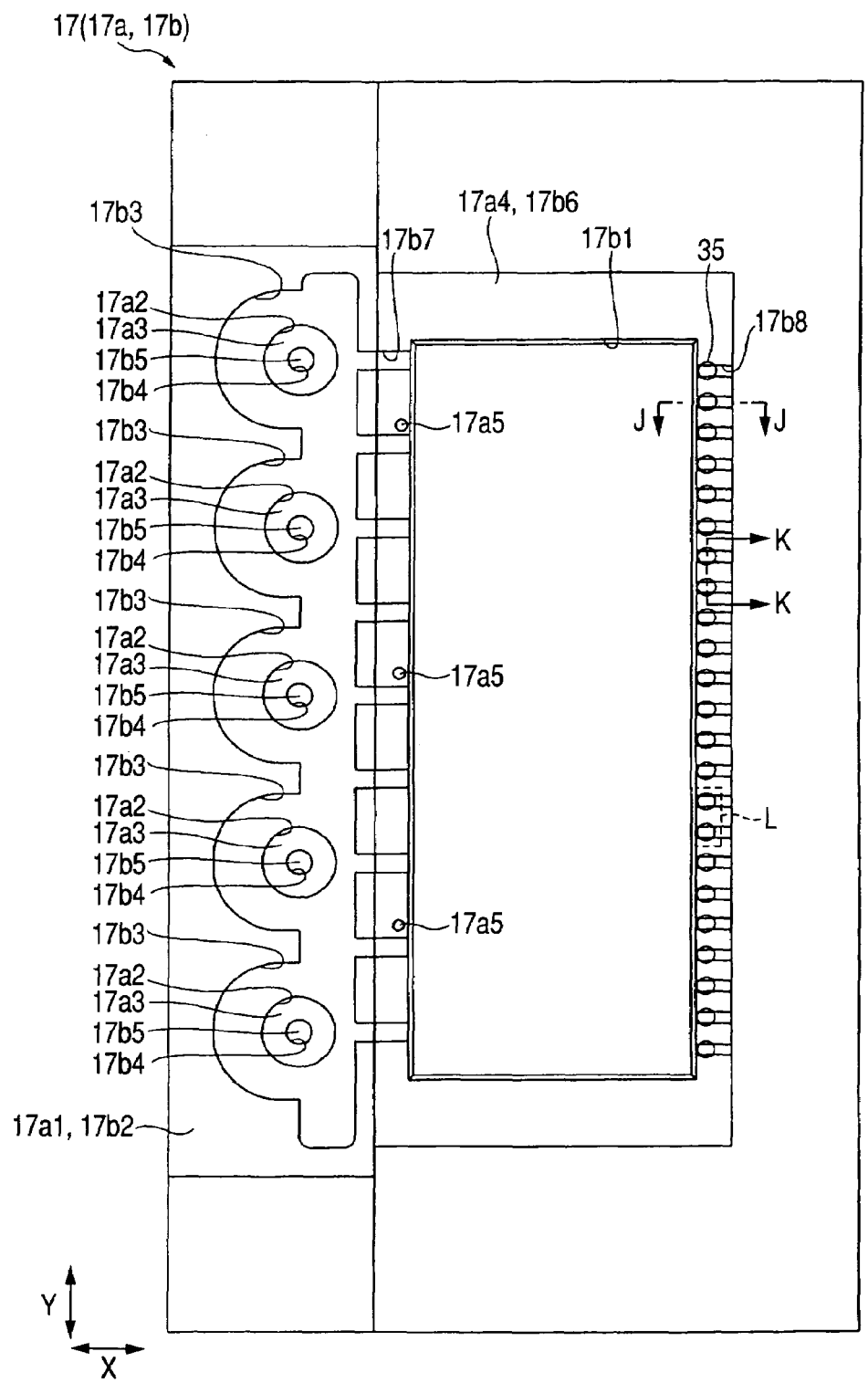
FIG. 38 is a plan view of a molding die used in a semiconductor device manufacturing method according to another embodiment of the present invention, showing a lower mold and an upper mold of the molding die in a mutually superimposed state.
Figure 39:
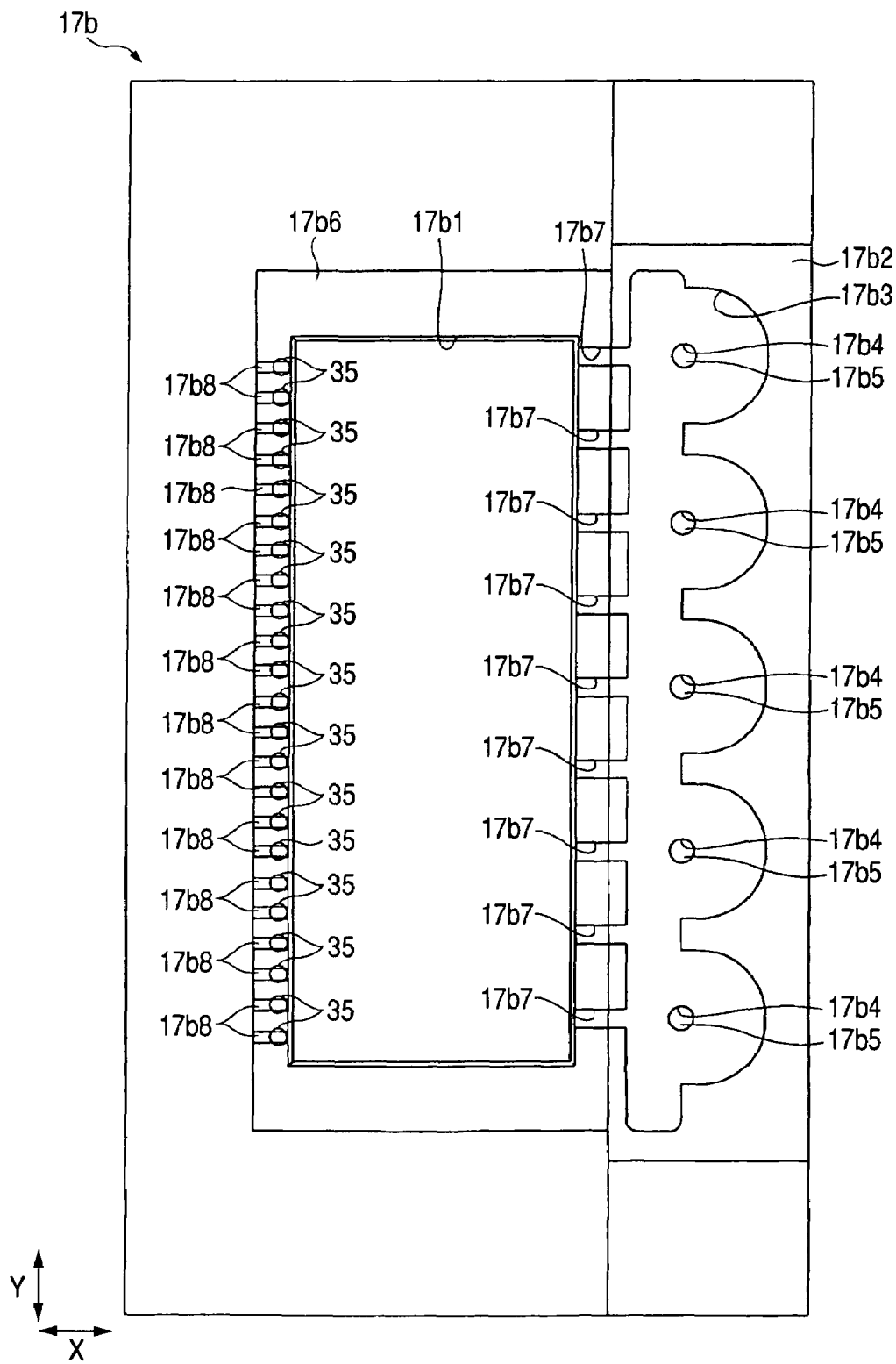
FIG. 39 is a plan view of a molding surface of the upper die in the molding die shown in FIG. 38.
Figure 40:
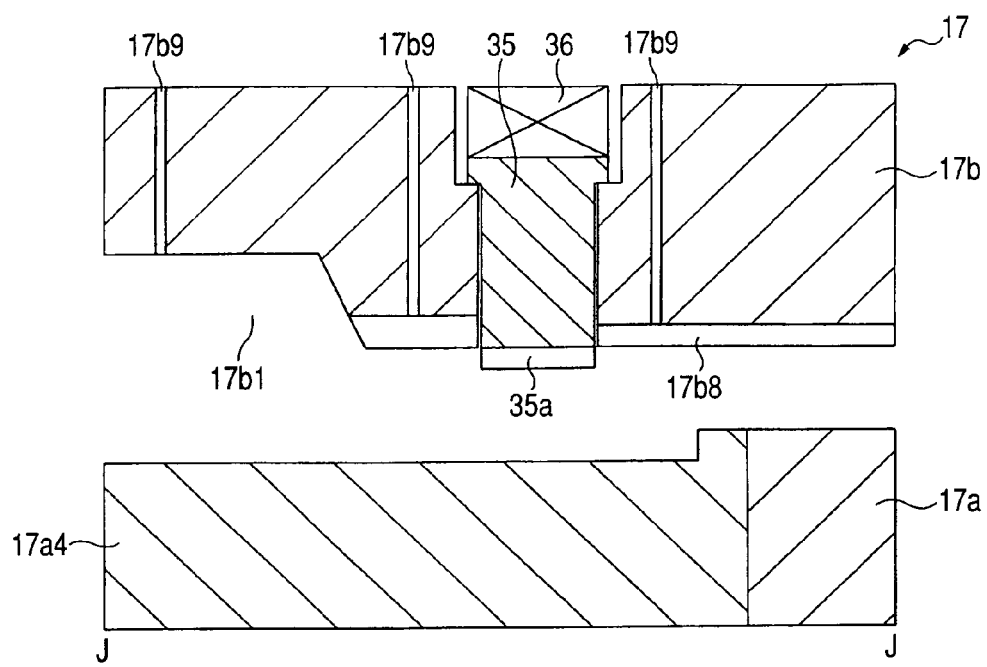
FIG. 40 is a sectional view taken on line J-J in FIG. 38.
Figure 41:
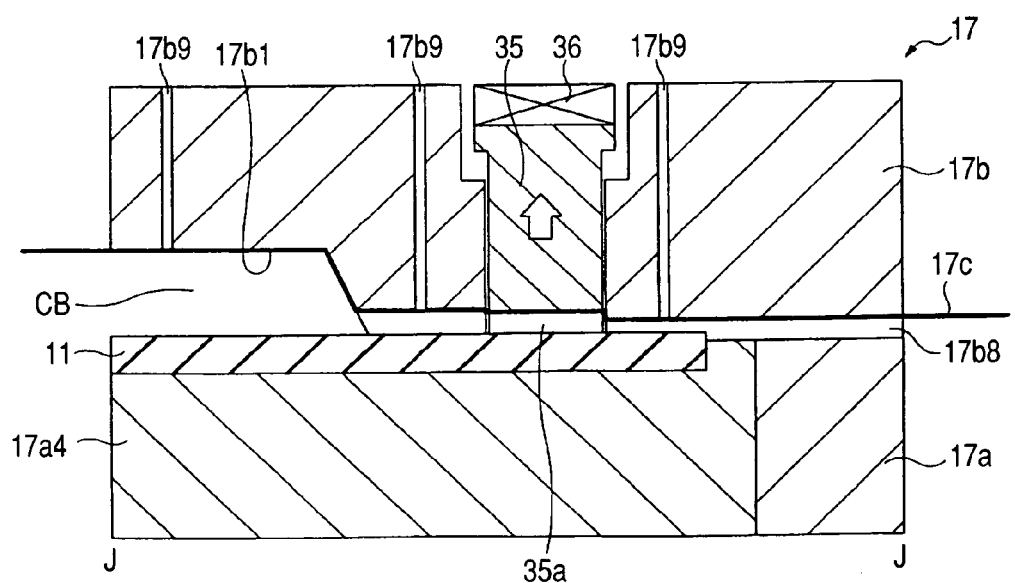
FIG. 41 is a sectional view taken on line J-J in FIG. 38 in a clamped state of a wiring substrate matrix.
Figure 42:
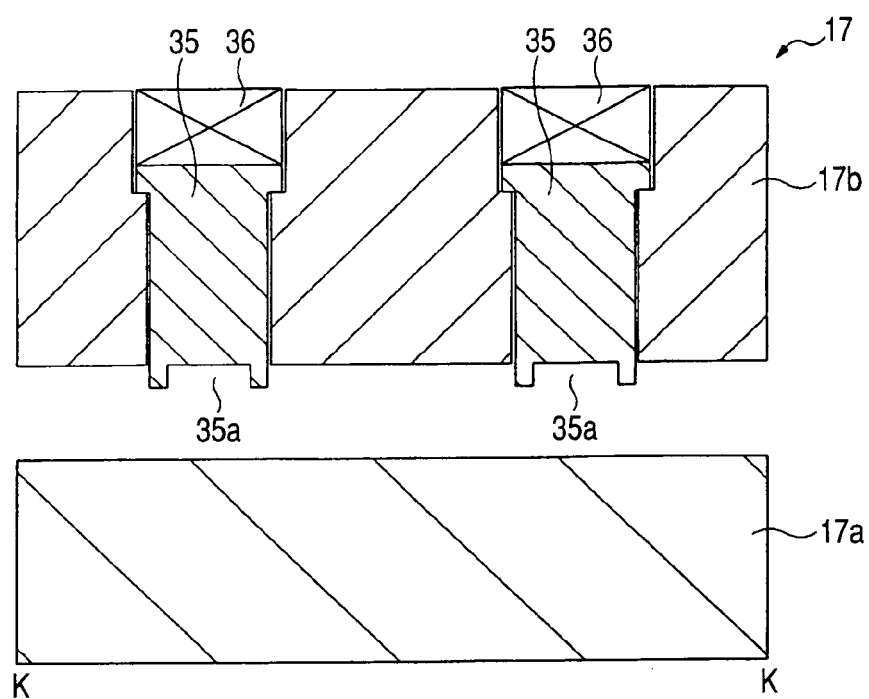
FIG. 42 is a sectional view taken on line k-K in FIG. 38.
Figure 43:
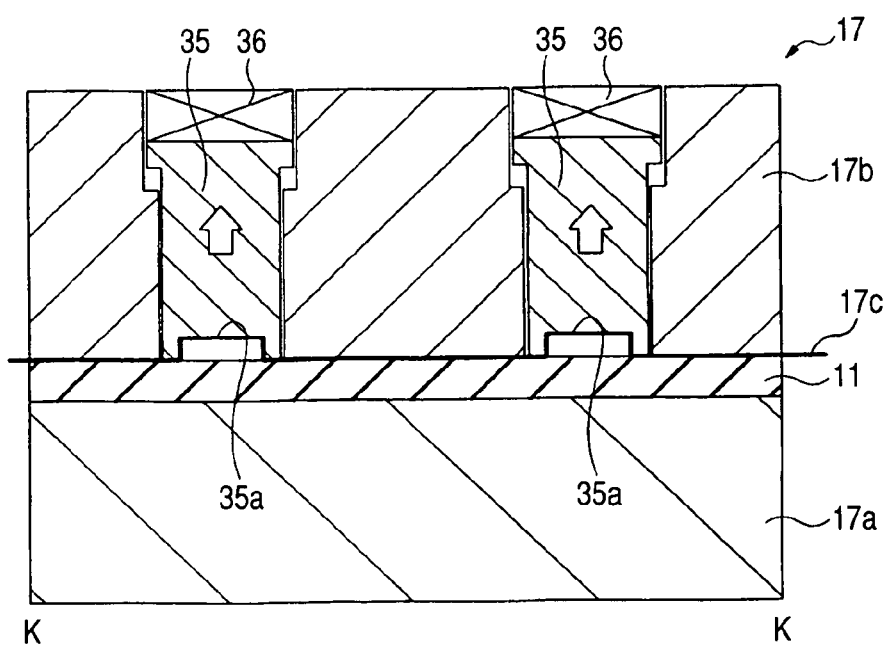
FIG. 43 is a sectional view taken on line k-K in FIG. 38 in a clamped state of the wiring substrate matrix.
Figure 44:
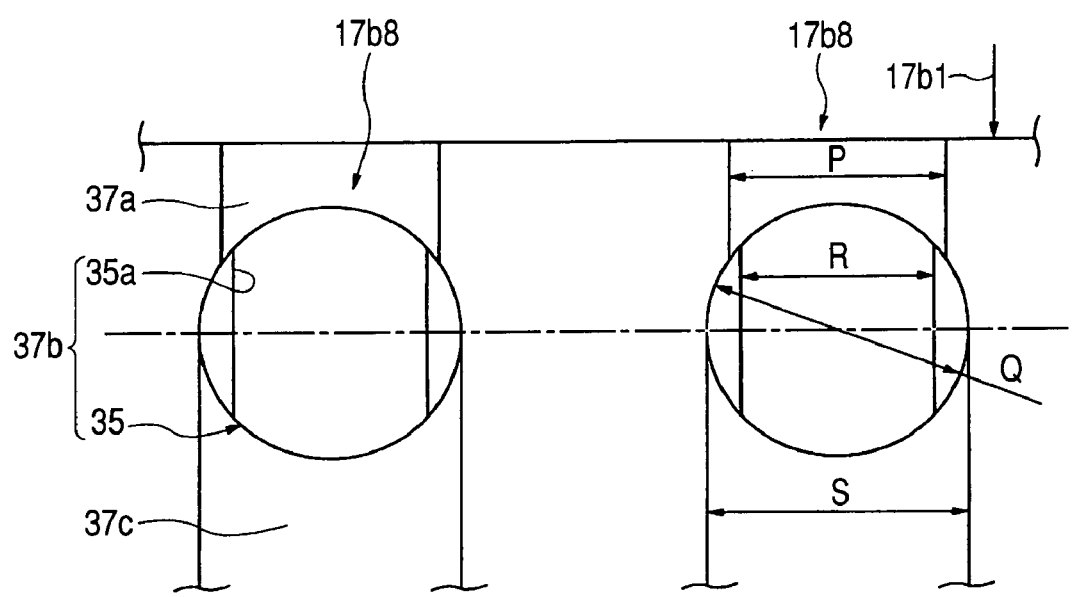
FIG. 44 is an enlarged plan view of an area L shown in FIG. 38.

FIG. 38 is a plan view of a molding apparatus 17 used in this second embodiment, showing a lower die 17a and a lower die 17b in a mutually superimposed state, FIG. 39 is a plan view of a molding surface of the upper die 17b in the molding apparatus 17 shown in FIG. 38, FIG. 40 is a sectional view taken on line J-J in FIG. 38, FIG. 41 is a sectional view taken on line J-J in FIG. 38 in a clamped state of a substrate matrix 11, FIG. 42 is a sectional view taken on line K-K in FIG. 38, FIG. 43 is a sectional view taken on line K-K in FIG. 38 in a clamped state of the substrate matrix 11, and FIG. 44 is an enlarged plan view of a region L shown in FIG. 38. The construction of the lower die 17a in the molding apparatus 17 used in this second embodiment is the same as in the first embodiment.

In this second embodiment, movable pins 35 are arranged respectively intermediate the paths of air vents 17b8 formed in an upper die 17b of a molding apparatus 17. Before closing of the molding apparatus 17, lower end portions of the movable pins 35 are projected from a molding surface of the upper die 17b. Grooves 35a are formed respectively in lower end faces of the movable pins 35 and constitute a part of the paths of the air vents 17b8. Elastic members 36 such as, for example, coiled springs or plate springs are installed on upper end faces (opposite to the lower end faces of the movable pins 35) of the movable pins 35. According to this construction, when the molding apparatus 17 is closed to clamp a substrate matrix 11 so as to be sandwiched by both the lower die 17a and the upper die 17b, the movable pins 35 are pushed by a parts mounting surface of the substrate matrix 11 and move upward, so that the elastic members 36 which overlie the movable pins 35 are compressed, while lower end faces of the movable pins 35 hold down the parts mounting surface of the substrate matrix 11 with repulsive force from the elastic members 36. Consequently, even if there occur variations in thickness of the substrate matrix 11 or even if concaves and convexes are formed by wiring (conductor patterns) on the parts mounting surface of the substrate matrix 11, the lower end faces of the movable pins 35 projecting into the air vents 17b8 come into close contact with the substrate matrix 11 while corresponding automatically to the state of the parts mounting surface of the substrate matrix 11 at the respective positions on the parts mounting surface when the substrate matrix is clamped by the molding apparatus 17. At this time, even if stop positions in the vertical direction of the movable pins 35 differ due to variations in thickness of the substrate matrix 11 or depending on the state of the parts mounting surface, the depths of the air vents 17b8 can be made constant automatically if the depths of the grooves 35a formed in the lower end faces of the movable pins 35 are constant. Consequently, the gas present in the resin-filled portion can be allowed to escape to the exterior in a satisfactory manner during injection of sealing resin and hence it is possible to inject the sealing resin into the cavity CB in a satisfactory manner. In the molding step, a resin injection pressure is applied directly to the air vents 17b8, but because of a small area thereof, an elastic force of the elastic members 36 relative to the movable pins 35 may be a load of such an extent as pushes the substrate matrix 11 lightly. Preferably, the elastic force of the elastic members 36 is set at a value much lower than the clamping pressure (e.g., 49 MPa (500 kg/cm$^2$)) of the molding die 17 for the substrate matrix 11, not causing deformation or damage of the substrate matrix, higher than the pressure applied to the air vents 17b8 upon injection of resin, and permitting the prevention of resin leakage. For example, the elastic force of the elastic members 36 is a load of about 6.86 MPa (70 kg/cm$^2$). Further, the elastic force of the elastic members 36 is set so as to give a movable quantity of the movable pins of, for example, about 100 to 200 μm.

In the molding apparatus 17 described above, as shown in FIG. 44, each air vent 17b8 can be classified into four portions along a flow path from an upper die cavity 17b1, which are a movable pin front portion 37a, a movable pin portion (or an air vent main portion, corresponding to each groove 35a) 37b, a movable pin rear portion 37c, and an open portion. The depth of the air vent 17b8 in the movable pin front portion 37a is, for example, about 50 to 60 μm. In this case, if a thickness error of the substrate matrix 11 is assumed to be, for example, about ±30 μm, an effective depth of the air vent 17b8 of about 30 to 40 μm can be ensured in the movable pin front portion 37a even in a thickest case of the substrate matrix 11. A cut depth of the movable pin 35 (depth of the groove 35a) is, for example, about 40 to 50 μm. In the movable pin rear portion 37c, it suffices for the depth of the air vent 17b8 to set at about 50 to 60 μm. This is because the movable pin rear portion 37c is immediately contiguous to the open portion having a depth of about 150 μm. Therefore, as described above, by making constant the effective depth of the main portion of the air vent 17b8 irrespective of the thickness of the substrate matrix 11, it is possible to prevent the leakage of resin effectively without making the clamping force of the molding apparatus 17 excessively strong. In the case where the substrate matrix 11 is thin in a negative direction of the tolerance, leakage of resin is apt to occur as described above, but in the molding apparatus 17 used in this second embodiments, since the movable pins 35 are held down lightly with the elastic force of the elastic members 3 and are not influenced directly by the resin injection pressure, it is possible to prevent the leakage of resin from the air vents 17b8. Besides, in each air vent 17b8, the depth of the movable pin front portion 37a and that of the movable pin rear portion 37c are different from each other, that is, the movable pin front portion 37a is deeper than the movable pin rear portion 37c. By thus making the movable pin front portion 37a deeper, even when the thickness of the substrate matrix 11 varies, the air vent 17b8 can be prevented from being closed by the variation and hence it is possible to surely ensure an aperture region in the air vent 17b8. A vent width P of the movable pin front portion 37a in each air vent 37b8 is smaller than the diameter Q of the movable pin 35. For example, it is preferable to set the diameter Q of the movable pin 35 at about 5 mm, the vent width P of the movable pin front portion 37a at about 4 mm, the vent width S of the movable pin rear portion 37c at about 5 mm, and the width R of the groove 35a in the lower end face of the movable pin 35 at about 2 to 3 mm. As a result, even when the substrate matrix 11 is formed thin in the negative direction of the thickness tolerance, leakage of the sealing resin can be prevented by the movable pin 35 and hence it is possible to surely prevent the leakage of the sealing resin.

Figure 45:
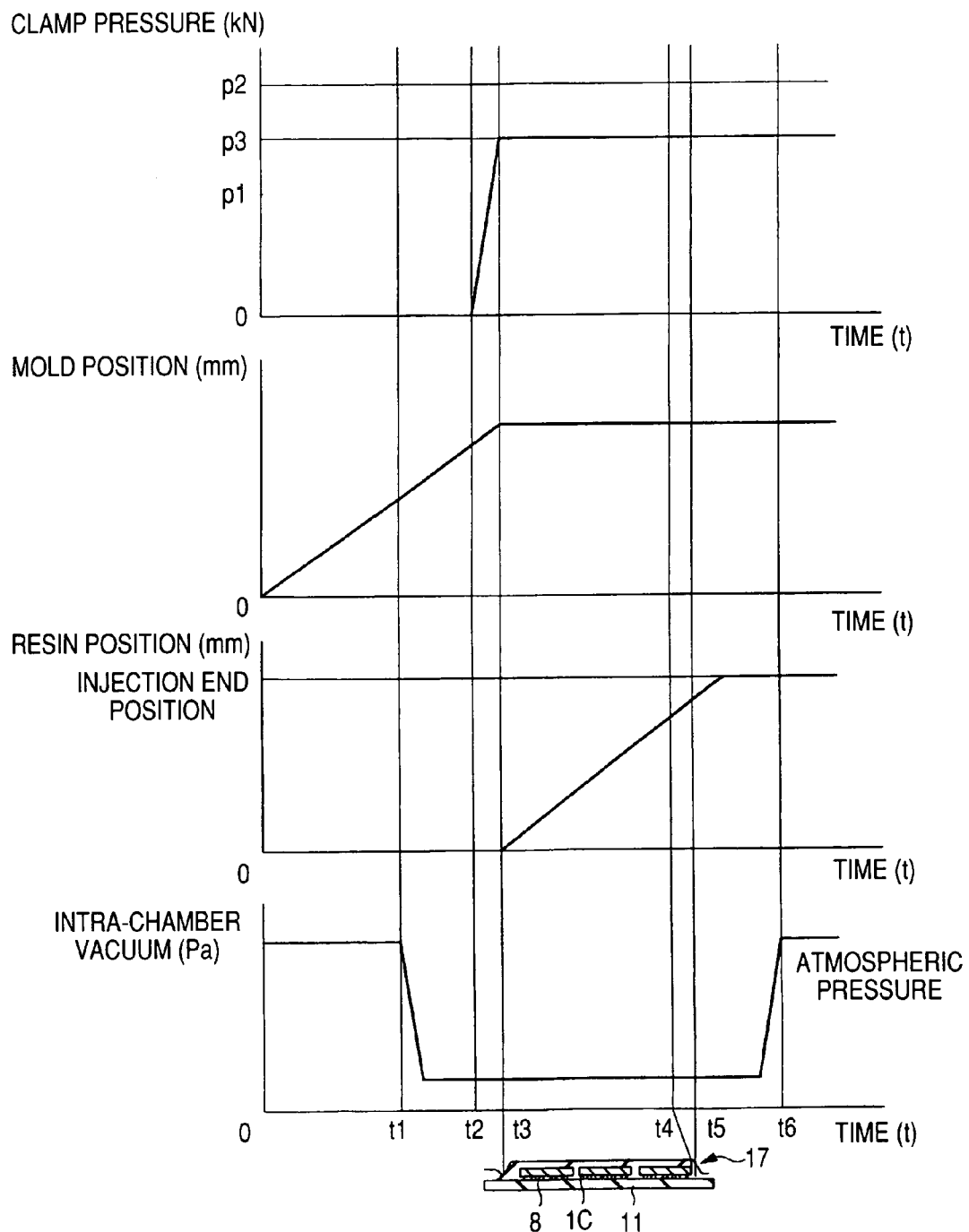
FIG. 45 is an operation chart in a molding step using the molding die shown in FIG. 38.

FIG. 45 is an operation chart in a molding process according to this second embodiment. In this second embodiment, the clamping pressure is not changed in two stages, but is kept constant from the beginning to end in the molding process.

More specifically, as in the first embodiment, the internal pressure of a vacuum chamber 17d is started to decrease at time t1; for example, it is set at about 133.322 Pa (=1 Torr). Thereafter, a lower die 17a is raised gradually so that the molding surface of the upper die 17b in the molding apparatus 17 approaches the parts mounting surface of the substrate matrix 11. Subsequently, at time t2 at which the molding surface of the upper die 17b comes into abutment against the parts mounting surface of the substrate matrix 1, the lower die 17a is further raised and is stopped when the clamping pressure of the substrate matrix 11 becomes the pressure P3, then substrate matrix 11 is clamped by both the lower die 17a and the upper die 17b. The pressure p3 is set at a pressure between the initial pressure p1 and the final pressure p2. Thereafter, the clamping pressure for the substrate matrix 1 is made p3, then in this state, at time t3 (coordinates x1), sealing resin 18m is started to be injected into the cavity CB through gates 17b7. The sealing resin 18m is injected into the cavity CB without changing the internal pressure of the cavity CB and the clamping pressure to complete the molding process. Subsequently, while maintaining the clamping pressure at p3, there is performed baking to cure. During this baking to cure, at time t6, the internal pressure of the vacuum chamber 17d is released to the atmospheric pressure and the substrate matrix 11 is taken out from the molding apparatus 17 to complete the process.

As shown in FIG. 48, a substrate loader 28 capable of supplying plural such substrate matrices 11 as described above to the molding die while holding the substrate matrices and a substrate unloader 32 capable of discharging the plural substrate matrices 11 after sealed with resin from the molding die and holding them, are arranged in a vacuum chamber 17d within the molding apparatus 17, whereby the resin sealing step can be repeated plural times while maintaining the state of vacuum. Therefore, the productivity can be further improved in comparison with the case where it is necessary to release the internal pressure of the vacuum chamber 17d to the atmospheric pressure at every resin sealing step.

In this second embodiment described above, even if variations in thickness of the substrate matrix 11 occur, particularly even when the thickness of the substrate matrix 11 is larger than the preset value within the range of tolerance, once the substrate matrix 11 is clamped by both the lower die 17a and the upper die 17b as described above, the movable pins 35 move upward by an amount corresponding to the thickness of the substrate matrix 1 and it is possible to ensure a gas flow path in each air vent 17b8, so that the sealing resin 18m can be charged into the cavity CB in a satisfactory manner. Consequently, it is possible to improve the yield of the semiconductor device which adopts the flip-chip mounting method.

On the other hand, even when there occur variations in thickness of the substrate matrix 11, particularly even when the thickness of the substrate matrix 11 is smaller than the preset value within the range of tolerance, once the substrate matrix 11 is clamped by both the lower die 17 and the upper die 17b as described above, the movable pins 35 move upward by an amount corresponding to the thickness of the substrate matrix 11 and the parts mounting surface of the substrate matrix 11 are held down moderately with the elastic force of the elastic member which overlies the movable pins 35. Therefore, the problem of the sealing resin 18m leaking out onto the parts mounting surface of the substrate matrix 11 from the air vents 17b8 does not occur. Thus, it is possible to improve the productivity of the semiconductor device which adopts the flip-chip mounting method.

Although the present invention has been described above concretely by way of embodiments thereof, it goes without saying that the present invention is not limited to the above embodiments and that various changes may be made within the scope not departing from the gist of the invention.

For example, although in the first and second embodiments the present invention is applied to the semiconductor device manufacturing method of MAP type, no limitation is made thereto, but the present invention is also applicable to a conventional molding process in which each individual chip is molded with sealing resin.

Although in the first and second embodiments a description has been given about the case where only chips mounted by the flip-chip mounting method are mounted on the substrate, the present invention is also applicable to a molding process of molding plural chips in a mixed state of both chips mounted on a substrate by the flip-chip mounting method and chips mounted on the substrate by the wire bonding method, like SIP (System In Package) for example.

Although in the above description the present invention is mainly applied to the method of manufacturing the semiconductor device of BGA type which is a background application field of the present invention, no limitation is made thereto, but the present invention is also applicable to various other methods. For example, the present invention is also applicable to a method of manufacturing a semiconductor device of LGA (Land Grid Array) package type in which flat electrode pads are arranged like an array.

The present invention is applicable to the semiconductor device manufacturing industry.

What is claimed is:

1. A method of manufacturing a semiconductor device, comprising the steps of:
    (a) providing a substrate;
    (b) mounting a semiconductor chip over a main surface of the substrate through protruded electrodes;
    (c) placing the substrate with the semiconductor chip mounted thereover onto a molding surface of a lower die of a resin molding die;
    (d) reducing the internal pressure of a cavity of the molding die; and
    (e) clamping the substrate so as to be sandwiched by the lower die and an upper die of the molding die and thereafter injecting a sealing resin into the cavity of the molding die and also between surfaces of the substrate and surfaces of the semiconductor chip opposing the surfaces of the substrate to seal the semiconductor chip, the step (e) comprising the steps of:
    (e1) establishing a relative positional relation between the lower die and the upper die so that a clamping pressure for the substrate becomes a first clamping pressure;
    (e2) after the step (e1), injecting the sealing resin through injection ports of the cavity of the molding die; and
    (e3) establishing a relative positional relation between the lower die and the upper die so that the clamping pressure for the substrate becomes a second clamping pressure higher than the first clamping pressure at a time point at which the sealing resin reaches a position intermediate between the injection ports and air vents in the molding die.

2. A method according to claim 1, wherein the substrate is a multi-layer wiring substrate.

3. A method according to claim 2, wherein the multi-layer wiring substrate is a laminate of a resin film and a metal foil.

4. A method of manufacturing a semiconductor device, comprising the steps of:
    (a) providing a substrate having a product region, the product region comprising a plurality of unit product regions;
    (b) mounting semiconductor chips over the unit product regions respectively through protruded electrodes;
    (c) placing the substrate with the semiconductor chips mounted thereover onto a molding surface of a lower die of a resin molding die;
    (d) reducing the internal pressure of a cavity of the molding die; and
    (e) clamping the substrate so as to be sandwiched by the lower die and an upper die of the molding die and thereafter injecting a sealing resin into the cavity of the molding die and also between surfaces of the substrate and surfaces of the semiconductor chips opposing the surfaces of the substrate to form a block sealing body which seals the semiconductor chips in the product region all together,
    the step (e) comprising the steps of:
    (e1) establishing a relative positional relation between the lower die and the upper die so that the clamping pressure for the substrate becomes a first clamping pressure;

(e2) after the step (e1), injecting the sealing resin through injection ports of the cavity of the molding die; and (e3) establishing a relative positional relation between the lower die and the upper die so that the clamping pressure for the substrate becomes a second clamping pressure higher than the first clamping pressure at a time point at which the sealing resin reaches a position intermediate between the injection ports and air vents in the molding die.

5. A method according to claim 4, wherein the substrate is a multi-layer wiring substrate.

6. A method according to claim 5, wherein the multi-layer wiring substrate is a laminate of a resin film and a metal foil.

7. A method according to claim 4, further comprising, after the step (e):

(f) forming protruded electrodes to a back surface of the substrate; and (g) after the step (f), cutting the block sealing body and the substrate into each of the unit product regions.

8. A method according to claim 1, wherein the substrate is a multi-layer wiring substrate.

9. A method according to claim 8, wherein the multi-layer wiring substrate is a laminate of a resin film and a metal foil.

* * * * *